US011680696B2

United States Patent
van der Sijde et al.

(10) Patent No.: US 11,680,696 B2
(45) Date of Patent: *Jun. 20, 2023

(54) SEGMENTED LED ARRAYS WITH DIFFUSING ELEMENTS

(71) Applicant: Lumileds LLC, San Jose, CA (US)

(72) Inventors: Arjen van der Sijde, Eindhoven (NL); Nicola Bettina Pfeffer, Eindhoven (NL)

(73) Assignee: Lumileds LLC, San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/746,155

(22) Filed: May 17, 2022

(65) Prior Publication Data

US 2022/0275924 A1    Sep. 1, 2022

Related U.S. Application Data

(63) Continuation of application No. PCT/US2020/064731, filed on Dec. 13, 2020, which is a continuation-in-part of application No. 16/713,045, filed on Dec. 13, 2019, now Pat. No. 11,489,005, application No. 17/746,155 is a
(Continued)

(51) Int. Cl.
*F21V 5/00* (2018.01)
*F21Y 115/10* (2016.01)

(52) U.S. Cl.
CPC .......... *F21V 5/007* (2013.01); *F21Y 2115/10* (2016.08)

(58) Field of Classification Search
CPC .................. H01L 2933/0091; H01L 33/58
See application file for complete search history.

(56) References Cited

U.S. PATENT DOCUMENTS

| 8,916,886 | B2 | 12/2014 | Engl et al. |
| 9,461,218 | B2 | 10/2016 | Illek et al. |
| 10,276,762 | B2 * | 4/2019 | Racz ............... E06B 9/171 |

(Continued)

FOREIGN PATENT DOCUMENTS

| EP | 2492577 A2 | 8/2012 |
| EP | 2975655 A1 | 1/2016 |

(Continued)

OTHER PUBLICATIONS

From the EPO as the ISA, Notification of Transmittal of the International Search Report and the Written Opinion of the International Searching Authority, or the Declaration, PCT/US2020/064731, dated Mar. 31, 2021, 13 pages.

(Continued)

*Primary Examiner* — Andrew J Coughlin

(57) ABSTRACT

LED arrays with diffusing elements are disclosed. In various embodiments, diffusing elements in the form of one or more structures of a diffuser material may be provided between an LED array and an optical element that collects light emitted by the array and directs the light to an optical far field. The optical element may image or approximately image the LED array. The diffusing elements at least partially blur patterning in the far field illumination that may otherwise arise from the optical element imaging the array. Each LED may be a wavelength-converting LED in that it may include a light emitter arrangement and a wavelength-converter structure.

20 Claims, 12 Drawing Sheets

Related U.S. Application Data continuation-in-part of application No. 16/713,045, filed on Dec. 13, 2019, now Pat. No. 11,489,005.

(56) References Cited

U.S. PATENT DOCUMENTS

| | | |
|---|---|---|
| 10,285,236 B2 | 5/2019 | Nelson et al. |
| 10,340,310 B2 | 7/2019 | Schrama et al. |
| 10,511,139 B2 | 12/2019 | Schrama |
| 2010/0096965 A1 | 4/2010 | Oyaizu et al. |
| 2012/0161162 A1 | 6/2012 | Engl et al. |
| 2015/0097198 A1 | 4/2015 | Illek et al. |
| 2015/0338065 A1 | 11/2015 | Wang et al. |
| 2017/0249501 A1 | 8/2017 | van der Sijde et al. |
| 2018/0129121 A1 | 5/2018 | van der Sijde et al. |
| 2018/0206298 A1 | 7/2018 | Chen |
| 2019/0159316 A1 | 5/2019 | Pfeffer et al. |
| 2019/0237935 A1 | 8/2019 | Schrama |
| 2019/0319019 A1 | 10/2019 | Engelen et al. |
| 2019/0324350 A1 | 10/2019 | van der Sijde et al. |
| 2021/0183940 A1 | 6/2021 | van der Sijde et al. |

FOREIGN PATENT DOCUMENTS

| | | |
|---|---|---|
| JP | 2010-034184 A | 2/2010 |
| WO | 03/012884 A1 | 2/2003 |
| WO | 2004-041022 A1 | 5/2004 |
| WO | 2009/158313 A1 | 12/2009 |
| WO | 2010/083929 A1 | 7/2010 |
| WO | 2013/064800 A1 | 5/2013 |
| WO | 2013/135470 A1 | 9/2013 |
| WO | 2019104182 A1 | 5/2019 |
| WO | 2021/119566 A1 | 6/2021 |

OTHER PUBLICATIONS

KR200312884Y1, corresponding to international application published under WO 2004/041022 A1.

* cited by examiner

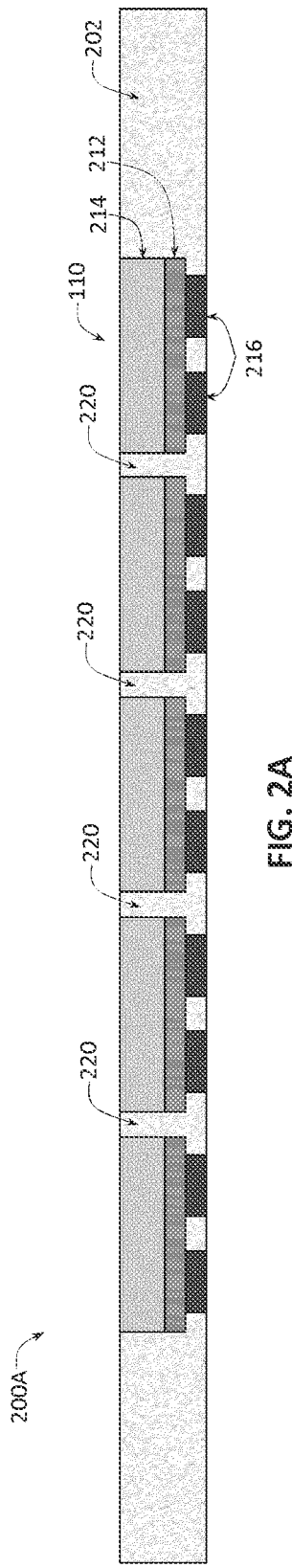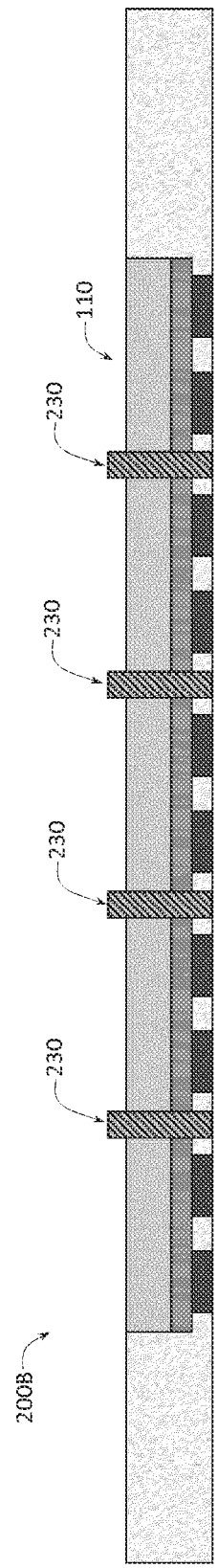
FIG. 2A
FIG. 2B

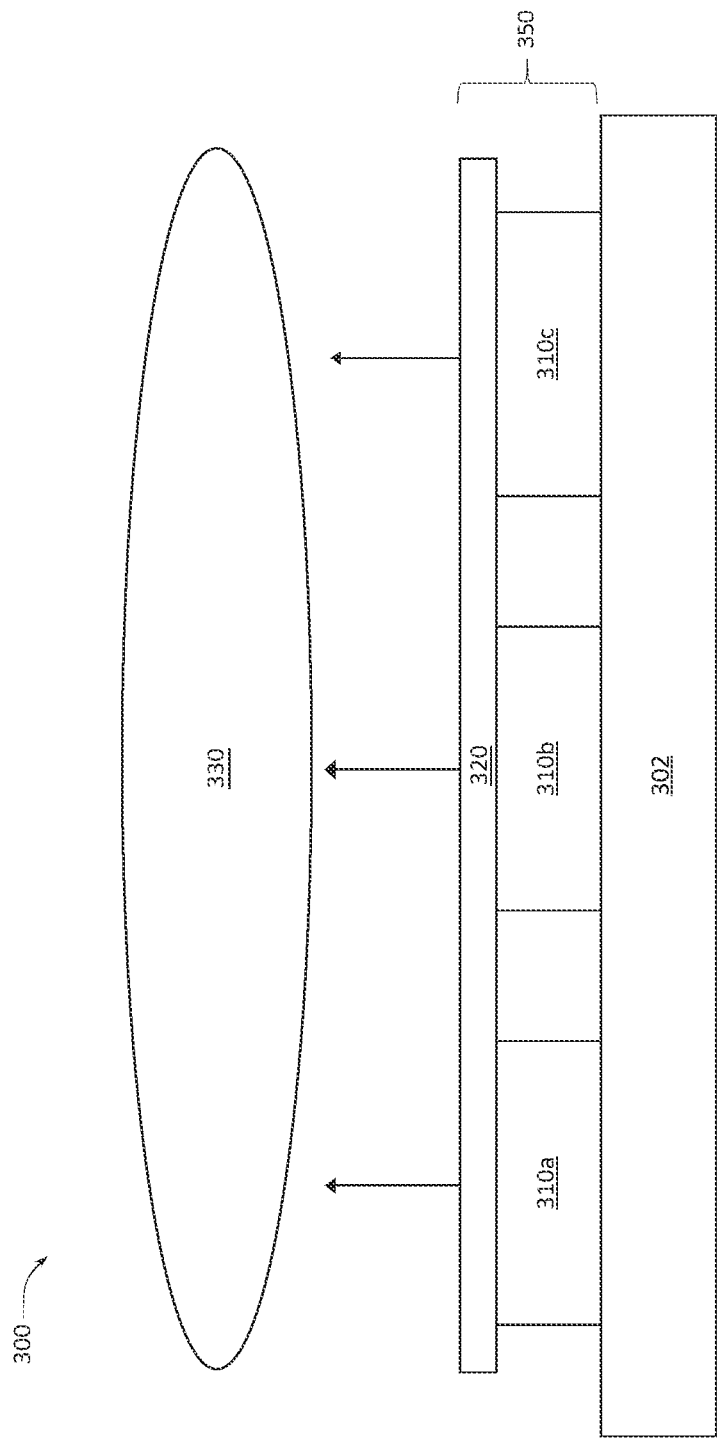

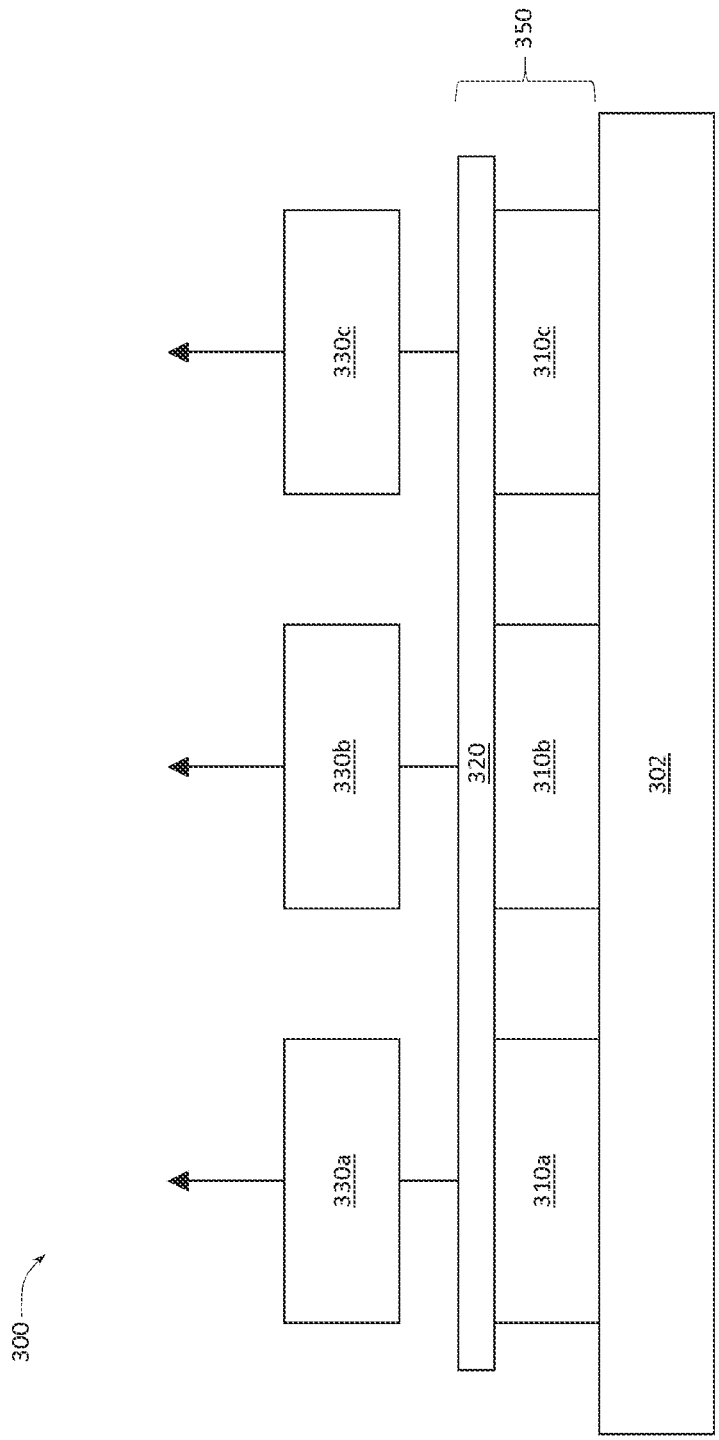

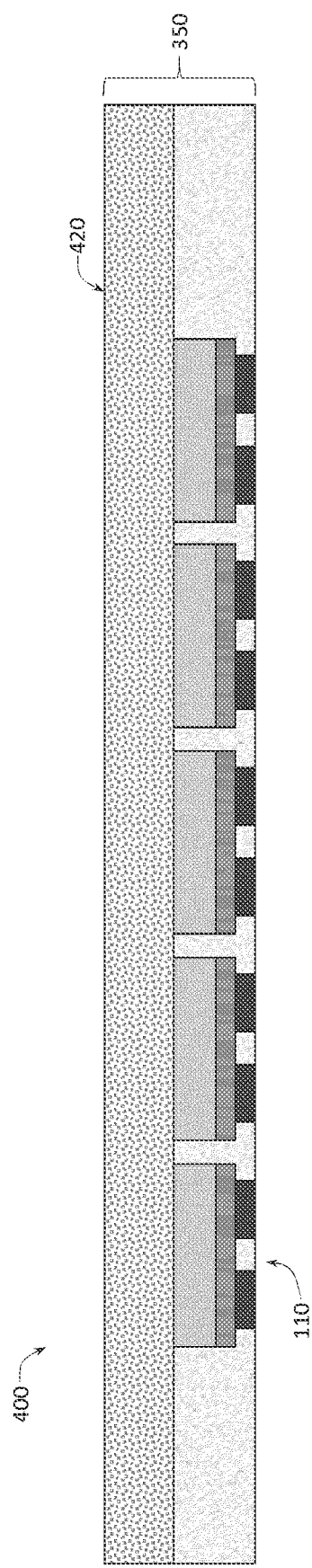
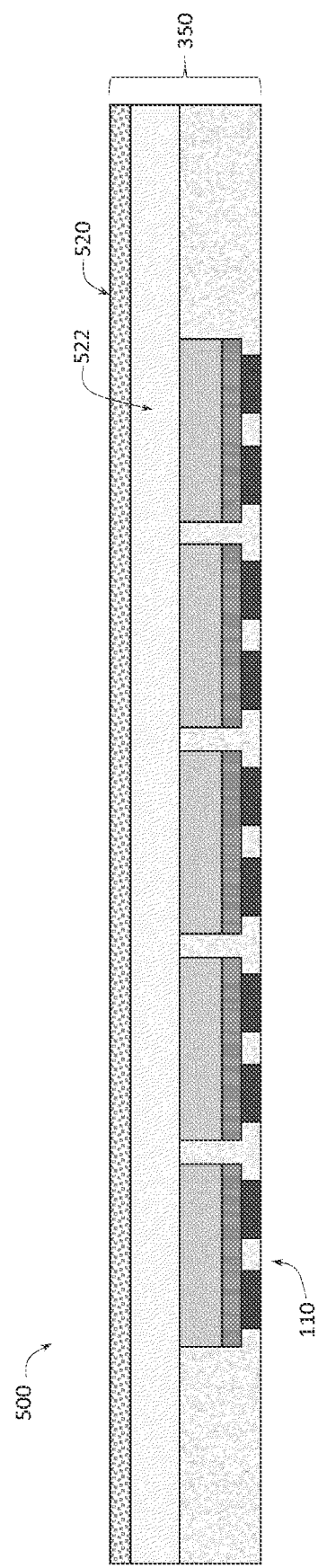

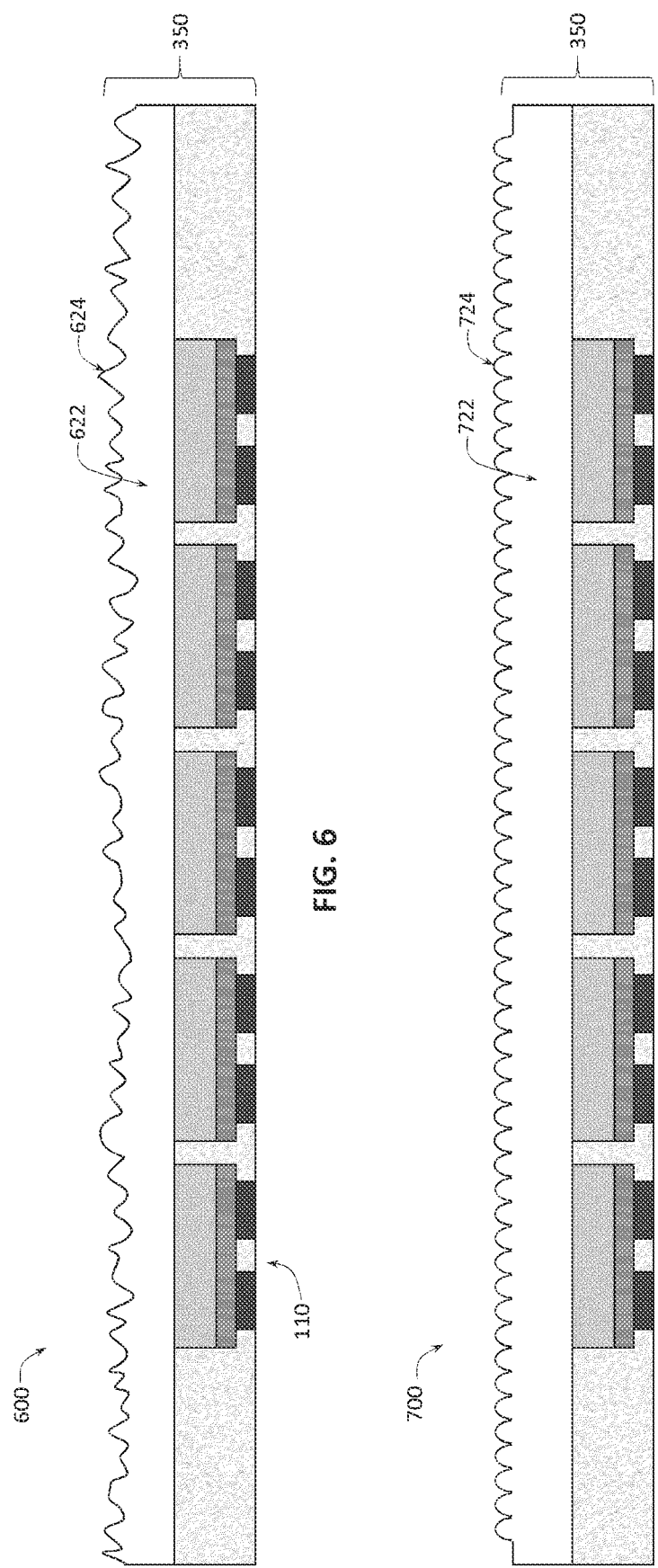

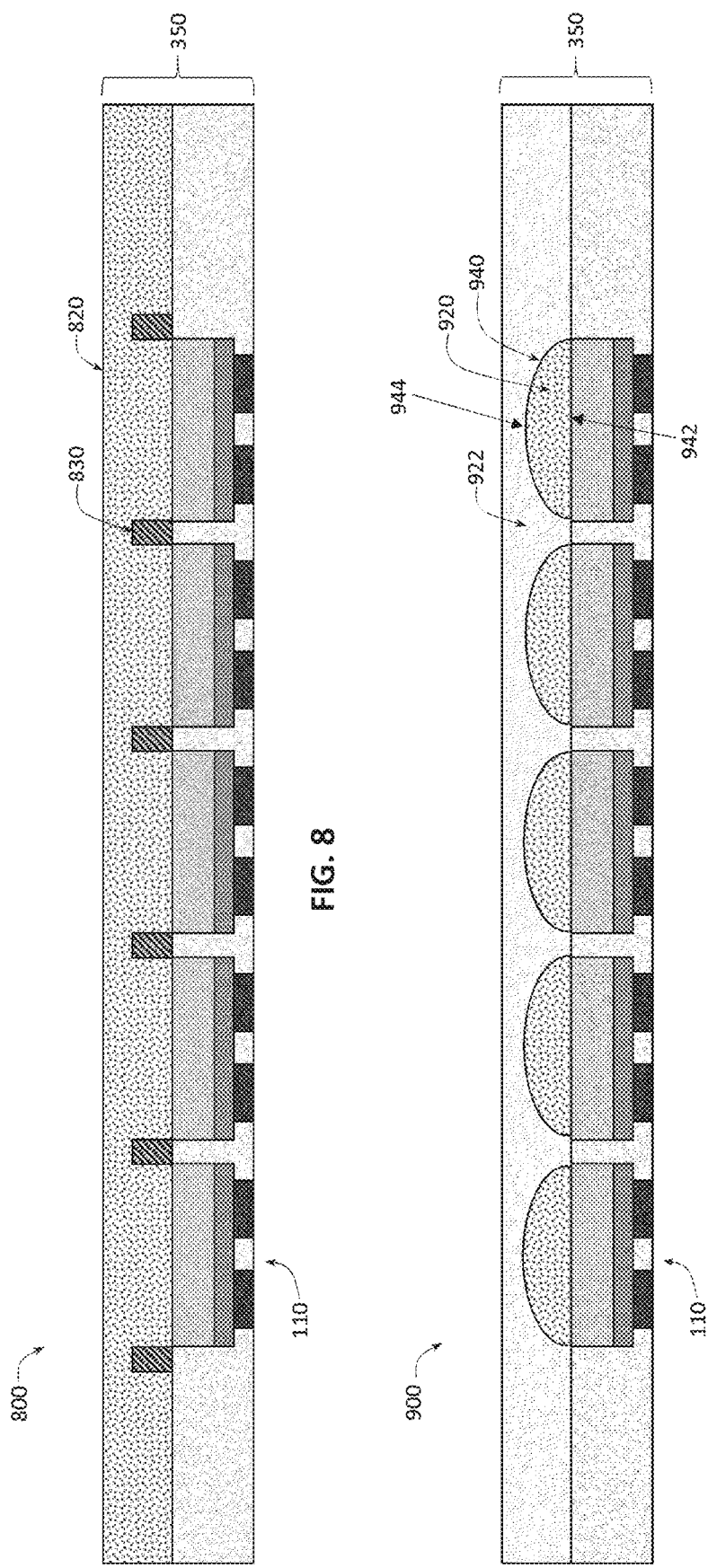

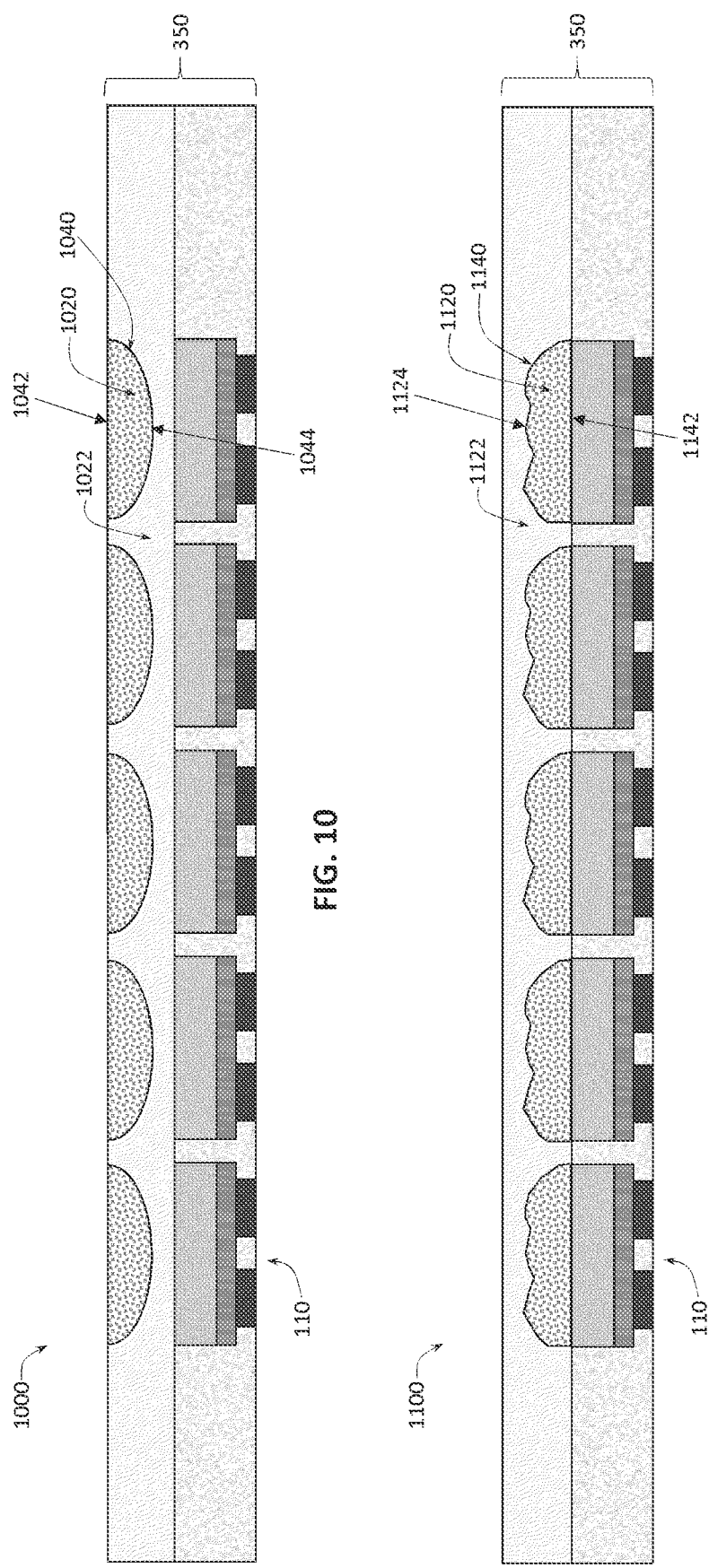

US 11,680,696 B2

SEGMENTED LED ARRAYS WITH DIFFUSING ELEMENTS

CROSS REFERENCE TO RELATED APPLICATIONS

This application is a continuation of PCT App. No. PCT/US2020/064731 filed 13 Dec. 2020, which claims benefit of priority to U.S. application Ser. No. 16/713,045 filed 13 Dec. 2019; this application is a continuation-in-part of U.S. application Ser. No. 16/713,045 filed 13 Dec. 2019. Each one of those applications is incorporated by reference as if set forth herein in its entirety.

TECHNICAL FIELD OF THE DISCLOSURE

The present disclosure relates generally to light emitting diodes (LEDs) and, more specifically, to segmented LED arrays. As used in this disclosure the term "light emitting diode" encompasses semiconductor laser diodes, for example vertical cavity emitting lasers (VCELS). as well as light emitting diodes that are not lasers, and also encompasses wavelength converted or phosphor converted variations of such devices. The LEDs referred to in this disclosure may emit ultraviolet, visible, or infrared light.

BACKGROUND

LEDs are commonly used as light sources in various applications. LEDs can be more energy-efficient than traditional light sources, providing much higher energy conversion efficiency than incandescent lamps and fluorescent light, for example. Furthermore, LEDs typically radiate less heat into illuminated regions and afford a greater breadth of control over brightness, emission color and spectrum than traditional light sources. These characteristics make LEDs an excellent choice for various lighting applications ranging from indoor illumination to automotive lighting.

BRIEF DESCRIPTION OF THE DRAWINGS

To provide a more complete understanding of the present disclosure and features and advantages thereof, reference is made to the following description, taken in conjunction with the accompanying figures, wherein like reference numerals represent like parts, in which:

FIG. 2A illustrates a cross-sectional side view of an example LED array with adjacent LEDs separated by trenches, according to some embodiments of the present disclosure;

FIG. 2B illustrates a cross-sectional side view of an example LED array with adjacent LEDs separated by walls, according to some embodiments of the present disclosure;

FIG. 3A and FIG. 3B provide block diagrams illustrating example light emitting devices with LEDs and optical elements, according to some embodiments of the present disclosure;

FIG. 4 illustrates a cross-sectional side view of an example LED array with a continuous layer of a diffuser material over a plurality of LEDs, according to some embodiments of the present disclosure;

FIG. 5 illustrates a cross-sectional side view of an example LED array with a continuous layer of a diffuser material over an optically transparent material over a plurality of LEDs, according to some embodiments of the present disclosure;

FIG. 6 illustrates a cross-sectional side view of an example LED array with a continuous layer of an optically transparent material with an irregular rough surface, according to some embodiments of the present disclosure;

FIG. 7 illustrates a cross-sectional side view of an example LED array with a continuous layer of an optically transparent material with periodic shapes at the surface, according to some embodiments of the present disclosure;

FIG. 8 illustrates a cross-sectional side view of an example LED array with a continuous layer of a diffuser material over a plurality of LEDs with partial segmentation, according to some embodiments of the present disclosure;

FIG. 9 illustrates a cross-sectional side view of an example LED array with respective dome-shaped structures of a diffuser material over each of a plurality of LEDs, according to some embodiments of the present disclosure;

FIG. 10 illustrates a cross-sectional side view of an example LED array with respective dome-shaped structures of a diffuser material over each of a plurality of LEDs, according to other embodiments of the present disclosure;

FIG. 11 illustrates a cross-sectional side view of an example LED array with respective dome-shaped structures of a diffuser material with a rough or structured surface over each of a plurality of LEDs, according to some embodiments of the present disclosure;

DESCRIPTION OF EXAMPLE EMBODIMENTS OF THE DISCLOSURE

Overview

Figure 1:
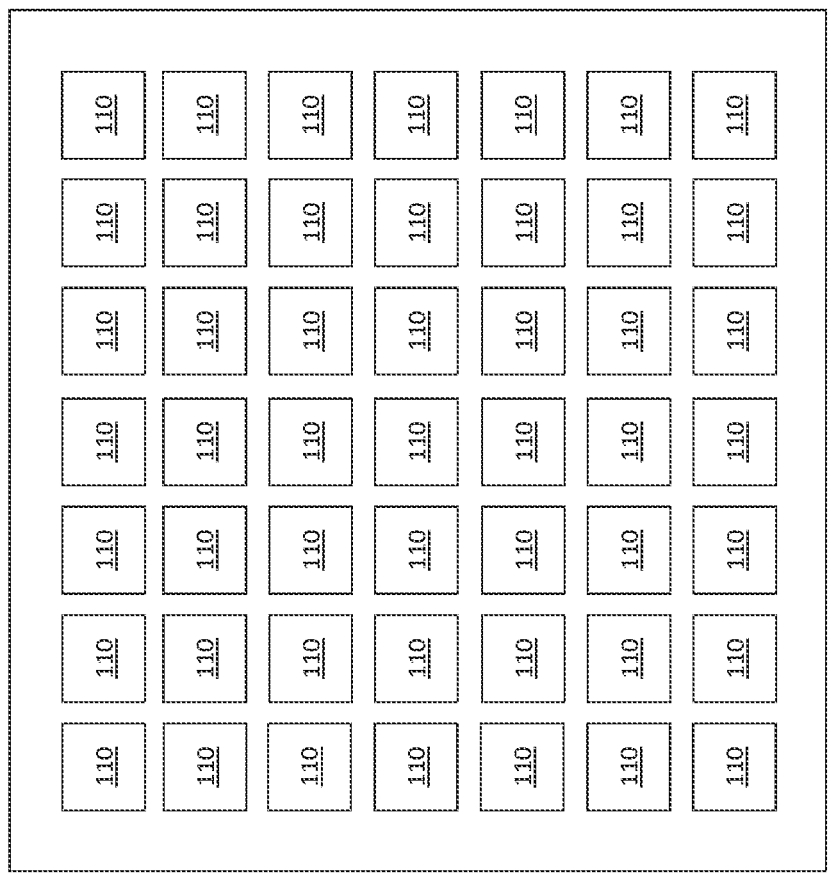
FIG. 1 illustrates a top-down view of an example LED array, according to some embodiments of the present disclosure.

The systems, methods and devices of this disclosure each have several innovative aspects, no single one of which is solely responsible for all of the desirable attributes disclosed herein. Details of one or more implementations of the subject matter described in this specification are set forth in the description below and the accompanying drawings.

For purposes of illustrating segmented LED arrays with diffusing elements described herein, it might be useful to understand phenomena that may come into play in context of segmented LED arrays. The following foundational information may be viewed as a basis from which the present disclosure may be properly explained. Such information is offered for purposes of explanation only and, accordingly, should not be construed in any way to limit the broad scope of the present disclosure and its potential applications.

LED arrays with imaging optics can achieve superior results in, e.g., strobe and video illumination by illuminating regions in the scene which require light and leaving out those which are sufficiently illuminated. To achieve this goal with LEDs such as wavelength-converting LEDs (e.g., LEDs that use a certain structure to emit light of a first wavelength, e.g., a stack of a p- and an n-type semiconductor layers with an active material in between, and then further use a structure, e.g., a layer of a phosphor material, to covert the first wavelength to a second wavelength), special efforts are taken to separate the different segments sufficiently optically to avoid color errors. This leads to an emitter design with trenches or walls between the segments, extending up to the total thickness of the wavelength-converting layer. In general, a segmented LED array (also sometimes referred to as a "segmented LED matrix") is an array of LEDs arranged in segments so that there is no light tunneling between the segments, which may be achieved by means of having trenches and/or walls filled with an optically non-transparent material between the segments.

While useful in some applications, the walls between the segments of segmented LED arrays may be imaged by an imaging lens or other optical element onto a scene, leading to a discernible patterned illumination, which may not be desirable. Defocusing the lens could help, but, in general, it may not be able to remove all of the patterns.

Embodiments of the present disclosure provide segmented LED arrays with various diffusing elements. In one aspect, a light emitter with a support structure (e.g., a substrate, a chip, or a die) and a segmented LED array provided over the support structure is disclosed. The segmented LED array may include a plurality of LEDs provided over the support structure and, optionally, optically and electrically separated from one another by trenches and/or walls. In some embodiments, the plurality of LEDs may be provided as a monolithic structure, e.g., the LEDs may be monolithically grown on a single support structure or may be provided over a monolithic piece of support structure and then separated into individual LEDs, or individual segments, during the fabrication process. That is, an array of LEDs, or portions of such an array, may be formed as a segmented monolithic structure in which individual LED pixels are electrically isolated from each other by trenches and/or insulating material, but the electrically isolated segments remain physically connected to each other by portions of the semiconductor structure. In other embodiments, the plurality of LEDs need not be monolithically grown on a single support structure but may be diced and then arranged on a mount such that the neighboring LEDs are very close together. For example, the LEDs may be provided as an array of a multitude of LEDs that have been fabricated beforehand and then arranged together on the support structure. The plurality of LEDs may be arranged in a plurality of sections where a given section may include one or more LEDs and where each section may be aligned with a different respective optical element such as a lens.

Arrays of LEDs as described herein may comprises, for example, tens, hundreds, or thousands of LEDs. For example, a 3×3 array may comprise 9 LEDs and a 7×7 array may comprise 49 LEDs. Arrays need not be square and may have any suitable arrangement and number of LEDs. Individual LEDs in the array may have widths (e.g., side lengths) in the plane of the array, for example, less than or equal to 1 millimeter (mm), less than or equal to 500 microns, less than or equal to 100 microns, or less than or equal to 50 microns. LEDs in such an array may be spaced apart from each other by streets or lanes having a width in the plane of the array of, for example, hundreds of microns, less than or equal to 200 microns, less than or equal to 100 microns, less than or equal to 40 microns, less than or equal to 10 microns, or less than or equal to 5 microns. Although the illustrated examples show rectangular pixels arranged in a symmetric matrix, the pixels and the array may have any suitable shape. LEDs having dimensions in the plane of the array (e.g., side lengths) of less than or equal to about 50 microns are typically referred to as microLEDs, and an array of such microLEDs may be referred to as a microLED array.

The individual LEDs in an LED array may be individually addressable, may be addressable as part of a group or subset of the pixels in the array, or may not be addressable. Thus, LED arrays may be useful for any application requiring or benefiting from fine-grained intensity, spatial, and temporal control of light distribution. These applications may include, but are not limited to, precise special patterning of emitted light from pixel blocks or individual pixels. Depending on the application, emitted light may be spectrally distinct, adaptive over time, and/or environmentally responsive. Such light emitting pixel arrays may provide pre-programmed light distribution in various intensity, spatial, or temporal patterns. The emitted light may be based at least in part on received sensor data and may be used for optical wireless communications. Associated electronics and optics may be distinct at a pixel, pixel block, or device level.

In some embodiments, each LED may be a wavelength-converting LED in that it may include a light emitter arrangement (i.e., an arrangement configured to emit light, the arrangement being, e.g., a stack of a p- and an n-type semiconductor layers with an active material in-between) and a wavelength-converter structure (i.e., a material configured to convert the wavelength of the light emitted by the light emitter arrangement, e.g., a layer of a phosphor material) provided over the light emitter arrangement. In various embodiments of wavelength-converting LEDs, diffusing elements in the form of one or more structures of a diffuser material may be provided over the wavelength-converter structure of one or more LEDs, the one or more structures being in a light path between the wavelength-converter structure and at least one of the plurality of optical elements, and configured to diffuse light emerging from the wavelength-converter structure. In other embodiments, the LEDs do not have to be wavelength-converting, or a combination of wavelength-converting and not-wavelength converting LEDs may be used. For LEDs that do not employ wavelength-converter structures, diffusing elements in the form of one or more structures of a diffuser material may be provided over the light emitter arrangement of one or more LEDs, the one or more structures being in a light path between the light emitter arrangement and at least one of the plurality of optical elements, and configured to diffuse light emitted by the light emitter arrangement. For example, in some embodiments, a segmented LED array may be provided with diffusing elements in the form of a plurality of columns or domes of a diffuser material provided over the light emitter arrangement (e.g., over the wavelength-converter structure) of each LED and configured to diffuse light emerging from the light emitter arrangement (e.g., emerging from the wavelength-converter structure), where the plurality of columns is in a light path between the light emitter arrangement and at least one of the plurality of optical elements. In other embodiments, a segmented LED array may be provided with diffusing elements in the form of a dome-shaped structure of a diffuser material provided over the light emitter arrangement or the wavelength-converter structure of each LED, aligned with the LED, and configured to diffuse light emerging from the light emitter arrangement or the wavelength-converter structure, where the dome-shaped structure is in a light path between the light emitter arrangement or the wavelength-converter structure and at least one of the plurality of optical elements. In still other embodiments, a segmented LED array may be provided with diffusing elements in the form of a continuous layer of a diffuser material provided over the light emitter arrangement or the wavelength-converter structure of at least two or more LEDs and configured to diffuse light emerging from the light emitter arrangement or the wavelength-converter structure of the at least two or more LEDs, the diffuser material being in a light path between the light emitter arrangement or the wavelength-converter structure of the at least two or more LEDs and at least one of the plurality of optical elements. Providing the diffusing elements directly over the light emitter arrangement or the wavelength-converter structure of the LEDs, before the light is incident on secondary optics in the form of optical elements, may help achieving more uniform illumination and tune luminance distribution using segmented LED arrays. Other features and advantages of the disclosure will be apparent from the following description and the claims. In the following, the descriptions are provided with reference to wavelength-converting LEDs, i.e., LEDs that use both the light emitter arrangement and the wavelength-converter structure. However, these descriptions are equally applicable to embodiments where at least some of the LEDs do not include the wavelength-converter structure, in which case references to the "wavelength-converter structure" in the descriptions are to be replaced with references to the "light emitter arrangement" instead, all of which embodiments being within the scope of the present disclosure.

In the drawings, some schematic illustrations of example structures of various devices and assemblies described herein may be shown with precise right angles and straight lines, but it is to be understood that such schematic illustrations may not reflect real-life process limitations which may cause the features to not look so "ideal" when any of the structures described herein are examined using, e.g., scanning electron microscopy (SEM) images or transmission electron microscope (TEM) images. In such images of real structures, possible processing defects could also be visible, e.g., not-perfectly straight edges of materials, tapered vias or other openings, inadvertent rounding of corners or variations in thicknesses of different material layers. There may be other defects not listed here but that are common within the field of device fabrication.

As will be appreciated by one skilled in the art, aspects of the present disclosure, in particular aspects of segmented LED arrays with diffusing elements, described herein, may be embodied in various manners—e.g. as a method, a system, a method of fabrication, or a method of operation. In the following detailed description, various aspects of the illustrative implementations may be described using terms commonly employed by those skilled in the art to convey the substance of their work to others skilled in the art. For example, the term "circuit" may refer to one or more passive and/or active components that are arranged to cooperate with one another to provide a desired function. The terms "substantially," "close," "approximately," "near," and "about," generally refer to being within +/−20%, preferably within +/−10%, of a target value based on the context of a particular value as described herein or as known in the art. Similarly, terms indicating orientation of various elements, e.g., "coplanar," "perpendicular," "orthogonal," "parallel," or any other angle between the elements, generally refer to being within +/−5-20% of a target value based on the context of a particular value as described herein or as known in the art. The terms such as "over," "under," "between," and "on" as used herein refer to a relative position of one material layer or component with respect to other layers or components. For example, one layer disposed over or under another layer may be directly in contact with the other layer or may have one or more intervening layers. Moreover, one layer disposed between two layers may be directly in contact with one or both of the two layers or may have one or more intervening layers. In contrast, a first layer described to be "on" a second layer refers to a layer that is in direct contact with that second layer. Similarly, unless explicitly stated otherwise, one feature disposed between two features may be in direct contact with the adjacent features or may have one or more intervening layers.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). The term "between," when used with reference to measurement ranges, is inclusive of the ends of the measurement ranges. As used herein, the notation "AB/C" means (A), (B), and/or (C).

The description uses the phrases "in an embodiment" or "in embodiments," which may each refer to one or more of the same or different embodiments. Furthermore, the terms "comprising," "including," "having," and the like, as used with respect to embodiments of the present disclosure, are synonymous. The disclosure may use perspective-based descriptions such as "above," "below," "top," "bottom," and "side"; such descriptions are used to facilitate the discussion and are not intended to restrict the application of disclosed embodiments. Unless otherwise specified, the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

In the following detailed description, reference is made to the accompanying drawings that form a part hereof, showing, by way of illustration, some of the embodiments that may be practiced. In the drawings, same reference numerals refer to the same or analogous elements/materials so that, unless stated otherwise, explanations of an element/material with a given reference numeral provided in context of one of the drawings are applicable to other drawings where elements/materials with the same reference numerals may be illustrated. The accompanying drawings are not necessarily drawn to scale. Moreover, it will be understood that certain embodiments can include more elements than illustrated in a drawing, certain embodiments can include a subset of the elements illustrated in a drawing, and certain embodiments can incorporate any suitable combination of features from two or more drawings.

It should be appreciated that the devices and systems described herein can be consolidated in any suitable manner. For example, any of the illustrated components, modules, and elements of the accompanying drawings may be combined in various possible configurations, all of which are clearly within the broad scope of the present disclosure. In certain cases, it may be easier to describe a device or a system by only referencing a limited number of elements, but, in general, devices and systems with number of elements other than what is described or shown in the drawings are within the scope of the present disclosure.

The following detailed description presents various descriptions of specific certain embodiments. However, is to be understood that other embodiments may be utilized, and structural or logical changes may be made without departing from the scope of the present disclosure. In general, the innovations described herein can be embodied in a multitude of different ways, for example, as defined and covered by the claims and/or select examples, and the following detailed description is not to be taken in a limiting sense.

Example Segmented LED Arrays

FIG. 1 illustrates a top-down view of an example LED array 100, according to some embodiments of the present disclosure. As shown in FIG. 1, the LED array 100 may include a plurality of LEDs 110 arranged in an array or a matrix. Though a 7×7 square array is illustrated in FIG. 1, any suitable number of LEDs may be used, and the array 100 need not be square, it may be rectangular or any suitable shape. The LEDs 110 may be, e.g., white LEDs, or other visible colors as red, green or blue LEDs, ultraviolet (UV) LEDs, infrared (IR) LEDs, or a combination thereof.

In some embodiments, the LEDs 110 may be monolithically grown on a single support structure, e.g., on a single substrate. Alternatively, the LEDs 110 need not be monolithically grown on a single substrate but may be diced then arranged on a mount such that neighboring LEDs are very close together. In some embodiments, the gap between adjacent ones of the LEDs 110 may be less than 1/3 of a dimension (for example, the width) of an individual LED 110. The size of the individual LEDs 110 may depend on several design parameters as, for example, building volume with optical lens included, field of view of an associated camera and number of LEDs 110 in the array 100. Though the individual LEDs 110 are shown in FIG. 1 to be square, this is not required; in other embodiments of the LED array 100, rectangular LEDs 110 or LEDs 110 of any suitable shape may be used.

FIG. 2A illustrates a cross-sectional side view of an example LED array 200A with adjacent LEDs 110 separated by trenches, according to some embodiments of the present disclosure, while FIG. 2B illustrates a cross-sectional side view of an example LED array 200B with adjacent LEDs 110 separated by walls, according to some embodiments of the present disclosure. Each of the arrays 200A and 200B may be seen as an example of the LED array 100, but now illustrating only 5 LEDs 110 in a given row (as described above, any number of the LEDs 110 may be included in the LED array 100), where only a single LED 110 is labeled with a reference numeral (while 5 are shown) in order to not clutter the drawings.

As shown in FIG. 2A, in some embodiments, an individual LED 110 may include a light emitter arrangement 212, a wavelength-converter structure 214 provided over the light emitter arrangement 212, and interconnects (or contacts) 216. In other embodiments, the wavelength-converter structure 214 may not be included in at least some of the LEDs 110.

In some embodiments, the light emitter arrangement 212 may be formed by growing a III-nitride material (i.e., a material including nitrogen and an element from group III of the periodic table, e.g., gallium nitride for blue or UV LEDs) or III-arsenide (i.e., a material including arsenic and an element from group III of the periodic table, e.g., gallium arsenide for IR LEDs) semiconductor structure on a growth substrate (not specifically shown in FIGS. 2A and 2B, although a support structure 202 could be such a grown substrate in some cases) as is known in the art. In some embodiments, the growth substrate may be sapphire but, in other embodiments, it may be any suitable substrate such as, for example, a non-III-nitride material, silicon carbide (SiC), silicon (Si), gallium nitride (GaN), or a composite substrate. A surface of the growth substrate on which the III-nitride or III-arsenide semiconductor structure is grown may be patterned, roughened, or textured before growth, which may improve light extraction from the device. A surface of the growth substrate opposite the growth surface (i.e. the surface through which a majority of light is extracted to be incident onto the wavelength-converter structure 214) may be patterned, roughened or textured before or after growth, which may improve light extraction from the device. In some embodiments, the support structure 202 may include multiple layers of various materials.

Although not specifically shown in FIG. 2A, in some embodiments, the semiconductor structure of the light emitter arrangement 212 may include a light emitting or active region sandwiched between n- and p-type regions. In some embodiments, an n-type region may be grown first and may include multiple layers of different compositions and dopant concentration including, for example, preparation layers such as buffer layers or nucleation layers, which may be n-type or not intentionally doped, and n- or even p-type device layers designed for particular optical, material, or electrical properties desirable for the light emitting region to efficiently emit light. A light emitting or active region may then be grown over the n-type region. Examples of suitable light emitting regions include a single thick or thin light emitting layer, or a multiple quantum well light emitting region including multiple thin or thick light emitting layers separated by barrier layers. A p-type region may then be grown over light emitting region. Similar to the n-type region, the p-type region may include multiple layers of different composition, thickness, and dopant concentration, including layers that are not intentionally doped, or n-type layers.

As described above, LEDs 110 in the array 200A may be formed on a single wafer, then diced, scribed or etched or other manufacturing processes to separate the emitting segments from each other on the wafer such that an array 200A with individual addressable LED segments in the array are still attached to each other. Alternatively, many LEDs 110 may be formed on a single wafer, then diced from the wafer, such that already-diced, individual LEDs are disposed on a mount to form the array 200A.

If used, the wavelength-converter structure 214 may be disposed in the path of light emitted by the light emitter arrangement 212. In some embodiments, the wavelength-converter structure 214 may include one or more wavelength-converting materials which may be, for example, conventional phosphors, organic phosphors, quantum dots, organic semiconductors, II-VI or III-V semiconductors, II-VI or III-V semiconductor quantum dots or nanocrystals, dyes, polymers, or other materials that luminesce. A wavelength-converting material of the wavelength-converter structure 214 may absorb light emitted by the light emitter arrangement 212 of the LED 110 and emit light of one or more different wavelengths. In the embodiments of LEDs that do employ the wavelength-converter structure 214, unconverted light emitted by the light emitter arrangement 212 may, but does not have to be, part of the final spectrum of light extracted from the LED 110. The final spectrum of light extracted from the LED 110 may be white, polychromatic, or monochromatic. Examples of common combinations include a blue-emitting light emitter arrangement 212 combined with a yellow-emitting wavelength-converter structure 214, a blue-emitting light emitter arrangement 212 combined with green- and red-emitting wavelength-converter structure 214, a UV-emitting light emitter arrangement 212 combined with blue- and yellow-emitting wavelength-converter structures 214, and a UV-emitting light emitter arrangement 212 combined with blue-, green-, and red-emitting wavelength-converter structures 214. Wavelength-converting materials emitting other colors of light may be added to tailor the spectrum of light extracted from the structure. In some embodiments, the wavelength-converter structure 214 may include light scattering or light diffusing elements such as titanium oxide (TiO2).

In some embodiments, the wavelength-converter structure 214 may be a structure that is fabricated separately from the light emitter arrangement 212 and attached to the light emitter arrangement 212, for example through wafer bonding or a suitable adhesive such as silicone or epoxy. One example of such a prefabricated wavelength-converting element is a ceramic phosphor, which is formed by, for example, sintering powder phosphor or the precursor materials of phosphor into a ceramic slab, which may then be diced into individual wavelength-converting elements. A ceramic phosphor may also be formed by, for example tape casting, where the ceramic is fabricated to the correct shape, with no dicing or cutting necessary. Examples of suitable non-ceramic pre-formed wavelength-converting elements include powder phosphors that are dispersed in transparent material such as silicone or glass that is rolled, cast, or otherwise formed into a sheet, then singulated into individual wavelength-converting elements, powder phosphors that are disposed in a transparent material such as silicone and laminated over the wafer of LEDs or individual LEDs, and phosphor mixed with silicone and disposed on a transparent substrate. The wavelength-converting element need not be pre-formed, it may be, for example, wavelength-converting material mixed with transparent binder that is laminated, dispensed, deposited, screen-printed, electrophoretically deposited, or otherwise positioned in the path of light emitted by the light emitter arrangements 212 of the LEDs 110.

In some embodiments, the wavelength-converter structure 214 may be disposed in direct contact with the light emitter arrangement 212 in some or all LEDs 110, as illustrated in FIG. 2A. In other embodiments of the LED array 200A, the wavelength-converter structure 214 need not be disposed in direct contact with the light emitter arrangement 212 and may be spaced apart from the light emitter arrangement 212 in one or more of the LEDs 110.

Interconnects 216 such as, for example, solder, stud bumps, gold layers, or any other suitable structure, may be used to electrically and physically connect LEDs 110 in the array 200A to a structure such as a mount, a printed circuit board, or any other suitable structure. The mount may be configured such that individual LEDs 110 may be individually controlled by a driver (e.g., by an LED driver 1416 of FIG. 14). The light emitted by the individual LEDs 110 may illuminate a different part of the scene. By changing the current to the individual LEDs 110, the light provided to a corresponding part of the scene can be modified.

As also shown in FIG. 2A, adjacent LEDs 110 may be separated by trenches 220. The trenches 220 may be filled with a material that is substantially non-transparent so that there is substantially no light tunneling between the different LEDs 110. Example materials that may be used to fill the trenches 220 include highly scattering materials achieved by mixing two materials with a large difference in refractive index, such as one or more of titanium dioxide, zirconium oxide or tantalum oxide dispersed in low refractive index silicone. Providing metallic flakes in a matrix may produce a reflective effect, if geometry allows, and may also be used in the trenches 220. In some embodiments, absorbing materials such as carbon dispersed in silicone could also be used to fill the trenches 220 to help provide largest contrast between the segments.

FIG. 2B illustrates a similar LED array as that shown in FIG. 2A, except that it further illustrates that, in some embodiments, walls 230 may be provided within the trenches 220. In some embodiments, the walls 230 may be taller than the LED 110 that is enclosed between the adjacent walls 230, as shown in FIG. 2B, thus preventing light emitted by that LED from travelling sideways towards neighboring LEDs. In other embodiments, the walls 230 may be the same height as the LEDs 110. In some embodiments aspects, the walls 230 may be formed of any suitable material (e.g., glass, metal, silicon etc.) with reflective coating, such as a metal (e.g., silver) or dielectric distributed Bragg reflectors (DBRs), for example. In some aspects, the walls 230 may be formed by a premixed combination of materials, such as a matrix grid formed from silicone mixed with light scattering particles such as for example titanium dioxide particles, or silicone mixed with phosphor particles, or silicone mixed with titanium dioxide particle and/or other light scattering particles. In some implementations, the walls 230 may be between 100% and 200% of the height of the LED 110 that is enclosed in it. The walls 230 may be formed using any suitable type of process, such as plasma enhanced chemical vapor deposition, atomic layer deposition, evaporation deposition, sputtering deposition, etching processes or silicone molding. All other descriptions provided with respect to the LED array 200A are applicable to the LED array 200B and, therefore, in the interests of brevity are not repeated.

Segmented LED arrays as described herein, e.g., the segmented LED arrays 100, 200A, or 200B, where the individual LEDs 110 may, but do not have to, include the wavelength-converter structure 214, may be included in a light emitting device.

FIG. 3A provides a block diagram illustrating an example light emitting device 300 comprising an array of LEDs and a lens, lens system, or similar optical element 330 arranged to collect light emitted by the array of LEDs and direct the collected light to the optical far field as an optical output from the device. For example, the optical element may image or approximately image the LED array into the far field.

As shown in FIG. 3A, the light emitting device 300 may include a support structure 302 (e.g., a substrate, a chip, or a die), and an LED array that includes a plurality of LED sections 310 provided over the support structure 302. In the example of FIG. 3B, three sections 310 are shown, labeled as LED sections 310a, 310b, and 310c, but in other embodiments any other number of sections 310 may be used. Each of the sections 310 may include one or more LEDs 110 as described above, and, together, the LEDs 110 of the LED sections 310 form an LED array such as any of the LED arrays 100, 200A, or 200B, described above.

Light emitting device 300 also comprises diffusing elements provided in or as a layer 320 which is in the light path between the LEDs 110 of the LED sections 310 and the optical element 330. In particular, diffusing elements in the form of one or more structures of a diffuser material may be provided over the light emitter arrangement 212 (e.g., over the wavelength-converter structure 214, if such a structure is used) of one or more LEDs 110 of any of the LED sections 310, the one or more structures of a diffuser material being in the layer 320 in the light path between the light emitter arrangement 212 and at least one of the plurality of optical elements 330, e.g., between the wavelength-converter structure 214 and at least one of the plurality of optical elements 330. Such diffusing elements may be configured to diffuse light emitted by the light emitter arrangement 212 or emerging from the wavelength-converter structure(s) 214 of the LEDs 110. A diffusing segmented LED arrangement 350, labeled in FIG. 3A, refers to a combination of the LEDs 110 of an LED array, e.g., a segmented LED array 100, 200A, or 200B (again, with or without the wavelength-converter structures 214), and one or more diffusing elements provided in the layer 320 over one or more of the light emitter arrangement 212 or the wavelength-converter structures 214 of the one or more LEDs 110. FIGS. 4-13, described below, provide different examples of the diffusing segmented LED arrangement 350.

If diffusing element layer 320 were not present, then optical element 330 might in some arrangements image the walls or gaps between the individual LED segments in the LED array into the optical far field. This may result in a discernible patterned illumination which may not be desirable, as noted above. Diffusing element layer 320 diffuses the light output from each LED segment, making the array more closely approximate a diffuse extended light source rather than a segmented light source, and blurs out the patterning in the far field image resulting from the segmented structure of the array.

In the example of FIG. 3B, each of the LED sections 310 may be aligned with a different optical element 330, the individual optical elements labeled in FIG. 3B as optical elements 330a, 330b, and 330c. In this example, as well, diffusing element layer 320 blurs out the patterning in the far field image that might otherwise arise from a segmented arrangement of LEDs within each LED section 310.

In various embodiments, the optical elements 330, 330a, 330b, and 330c may include lenses, apertures (e.g., barrels or lens barrels), or, more generally, any suitable type of device that is configured to guide light emitted by the LEDs 110 of the LED sections 310 to/from particular directions.

Various Diffusing Element(s) Designs

Diffusing elements employed in light emitting devices as described herein may be formed from diffuser materials selected not to absorb light emitted by the LEDs. That is, the diffuser materials may be selected not to absorb light emitted by semiconducting light emitting structures in the LEDs and not to absorb light emitted by any wavelength converting structures in or associated with the LEDs. Alternatively, the diffusing elements may be formed from or include wavelength converting material such as, for example, phosphor particles or ceramic phosphor structures that absorb light emitted by the LEDs and emit light of longer wavelength than the absorbed light.

FIG. 4 illustrates a cross-sectional side view of an example LED array 400 with a continuous layer of a diffuser material 420 over a plurality of the LEDs 110, according to some embodiments of the present disclosure. The LEDs 110 shown in FIG. 4 (only one of which is labeled in order to not clutter the drawing) may be the LEDs of any of the LED arrays described with reference to FIGS. 1, 2A, and 2B. Together, the plurality of the LEDs 110 and the diffuser material 420 provide one example of the diffusing segmented LED arrangement 350 described with reference to FIG. 3A and FIG. 3B, where the layer of the diffuser material 420 as shown in FIG. 4 is an example of a diffusing element of the layer 320. The diffuser material 420 may be, e.g., a volume diffuser material such as titanium oxide containing silicone, zirconia, tantalum oxide, or aluminum oxide containing low refractive index silicone, magnesium fluoride dispersed in high refractive silicone or porous glass or sol-gel structures. As noted above, the diffuser material may alternatively be or comprise wavelength converting material, optionally in combination with diffuser material that does not absorb light emitted by the LEDs. In some examples, a thickness of the diffuser material 420 may be between about 0.01 and 0.5 millimeters, including all values and ranges therein.

FIG. 5 illustrates a cross-sectional side view of an example LED array 500 with a continuous layer of a diffuser material 520 over an optically transparent material 522 over a plurality of the LEDs 110, according to some embodiments of the present disclosure. The LEDs 110 shown in FIG. 5 (only one of which is labeled in order to not clutter the drawing) may be the LEDs of any of the LED arrays described with reference to FIGS. 1, 2A, and 2B. Together, the plurality of the LEDs 110, the diffuser material 520, and the optically transparent material 522 provide one example of the diffusing segmented LED arrangement 350 described with reference to FIG. 3A and FIG. 3B, where a combination of the layer of the diffuser material 520 and the layer of the optically transparent material 522 as shown in FIG. 5 is an example of a diffusing element of the layer 320. The diffuser material 520 may be any of the materials listed for the diffuser material 420. The optically transparent material 522 may be a substantially optically transparent material, e.g., a material that is at least about 90% transparent to the light emitted from the wavelength-converter structure 214 of the LEDs 110, such as silicone, glass, epoxy, sol-gel. In some examples, a thickness of the diffuser material 520 may be between about 0.01 and 0.5 millimeters, including all values and ranges therein. In some examples, a thickness of the optically transparent material 522 may be between about 0.01 and 0.5 millimeters, including all values and ranges therein.

FIG. 6 illustrates a cross-sectional side view of an example LED array 600 with a continuous layer of an optically transparent material 622 with an irregular rough surface 624 over a plurality of the LEDs 110, according to some embodiments of the present disclosure. The LEDs 110 shown in FIG. 6 (only one of which is labeled in order to not clutter the drawing) may be the LEDs of any of the LED arrays described with reference to FIGS. 1, 2A, and 2B. Together, the plurality of the LEDs 110 and the optically transparent material 622 with the irregular rough surface 624 provide one example of the diffusing segmented LED arrangement 350 described with reference to FIG. 3A and FIG. 3B, where the optically transparent material 622 with the irregular rough surface 624 as shown in FIG. 6 is an example of a diffusing element of the layer 320 because the irregular rough surface 624 may act as a surface diffuser for the light emitted from the wavelength-converter material 214 of the LEDs 110. The optically transparent material 622 may be any of the materials listed for the optically transparent material 522. In some examples, an average thickness of the optically transparent material 622 may be between about 0.01 and 0.5 millimeters, including all values and ranges therein. In some examples, a surface roughness of the optically transparent material 622 may be between about 10 nanometers and 200 micrometers, including all values and ranges therein.

Although not specifically shown in the present drawings, in further embodiments, the diffusing element of the layer 320 may be realized by implementing the optically transparent material 622 with the irregular rough surface 624 as shown in FIG. 6 except that at least some, or all of the optically transparent material 622 may be replaced with a diffuser material such as any of the materials listed for the diffuser material 420. In still further embodiments, such a diffuser material may be provided as a layer or over certain portions of the LEDs 110 in addition to the optically transparent material 622 with the irregular rough surface 624 as shown in FIG. 6.

FIG. 7 illustrates a cross-sectional side view of an example LED array 700 with a continuous layer of an optically transparent material 722 with a surface 724 that includes periodic shapes, over a plurality of the LEDs 110, according to some embodiments of the present disclosure. The LEDs 110 shown in FIG. 7 (only one of which is labeled in order to not clutter the drawing) may be the LEDs of any of the LED arrays described with reference to FIGS. 1, 2A, and 2B. Together, the plurality of the LEDs 110 and the optically transparent material 722 with the structured repeating pattern surface 724 provide one example of the diffusing segmented LED arrangement 350 described with reference to FIG. 3A and FIG. 3B, where the optically transparent material 722 with the periodic structured surface 724 as shown in FIG. 7 is an example of a diffusing element of the layer 320 because the periodic structured surface 724 may act as a surface diffuser for the light emitted from the wavelength-converter material 214 of the LEDs 110. While FIG. 7 illustrates the surface 724 that includes half-dome shapes, in other embodiments, the surface 724 may include a periodic repeating pattern of any other shapes, e.g., triangles, columns, etc. The optically transparent material 722 may be any of the materials listed for the optically transparent material 522. In some examples, an average thickness of the optically transparent material 722 may be between about 0.01 and 0.5 millimeters, including all values and ranges therein. In some examples, a surface roughness of the optically transparent material 722 may be between about 10 nanometers and 200 micrometers, including all values and ranges therein.

Although not specifically shown in the present drawings, in further embodiments, the diffusing element of the layer 320 may be realized by implementing the optically transparent material 722 with the periodic structured surface 724 as described with reference to FIG. 7 except that at least some, or all of the optically transparent material 722 may be replaced with a diffuser material such as any of the materials listed for the diffuser material 420. In still further embodiments, such a diffuser material may be provided as a layer or over certain portions of the LEDs 110 in addition to the optically transparent material 722 with the periodic structured surface 724 as shown in FIG. 7.

FIG. 8 illustrates a cross-sectional side view of an example LED array 800 with a continuous layer of a diffuser material 820 over a plurality of the LEDs 110 with partial segmentation, according to some embodiments of the present disclosure. The LEDs 110 shown in FIG. 8 (only one of which is labeled in order to not clutter the drawing) may be the LEDs of any of the LED arrays described with reference to FIGS. 1, 2A, and 2B. Together, the plurality of the LEDs 110, the diffuser material 820, and the partial segmentation implemented as walls 830 (only one of which is labeled in FIG. 8 in order to not clutter the drawing) between adjacent LEDs 110 provide one example of the diffusing segmented LED arrangement 350 described with reference to FIG. 3A and FIG. 3B, where the layer of the diffuser material 820 as shown in FIG. 8 is an example of a diffusing element of the layer 320. The diffuser material 820 may be any of the materials listed for the diffuser material 420. In some examples, a thickness of the diffuser material 820 may be about the same as that of the diffuser material 420. In some examples, a height of the walls 830 may be between about 0.01 and 0.5 millimeters, including all values and ranges therein. The walls 826 may be made of any of the materials listed for the walls 230.

FIG. 9 illustrates a cross-sectional side view of an example LED array 900 with respective dome-shaped structures 940 of a diffuser material 920 over each of a plurality of the LEDs 110, according to some embodiments of the present disclosure. As shown in FIG. 9, in some embodiments, each of the dome-shaped structures 940 may be aligned with the respective LED 110. In some embodiments, for at least one LED 110, the dome-shaped structure 940 may have a substantially convex shape with a base 942 of the dome-shaped structure 942 aligned with the wavelength-converter structure and with a tip 944 of the dome-shaped structure extending away from the wavelength-converter structure 214. This geometry is shown in the example of FIG. 9 for all of the LEDs 110. In some embodiments, the base 942 of the dome-shaped structures 940 may be in contact with the corresponding wavelength-converter structures 214. The dome-shaped structures 940 may be configured to diffuse light emerging from the wavelength-converter structure 214 of the respective LEDs 110 by virtue of being formed from the diffuser material 920. In some embodiments, an optically transparent material 922 may be provided over the dome-shaped structures 940. The LEDs 110 shown in FIG. 9 (only one of which is labeled in order to not clutter the drawing) may be the LEDs of any of the LED arrays described with reference to FIGS. 1, 2A, and 2B. Together, the plurality of the LEDs 110, the dome-shaped structures 940 of the diffuser material 920, and, optionally, the optically transparent material 922 provide one example of the diffusing segmented LED arrangement 350 described with reference to FIG. 3A and FIG. 3B, where the dome-shaped structures 940 of the diffuser material 920 are examples of diffusing elements of the layer 320. The diffuser material 920 may be any of the materials listed for the diffuser material 420. The optically transparent material 922 may be any of the materials listed for the optically transparent material 522. In some examples, a thickness of the diffuser material 920 at the center of the dome-shaped structures 940 may be about the same as that of the diffuser material 420.

FIG. 10 illustrates a cross-sectional side view of an example LED array 1000 with respective dome-shaped structures 1040 of a diffuser material 1020 over each of a plurality of the LEDs 110, according to some embodiments of the present disclosure. As shown in FIG. 10, in some embodiments, each of the dome-shaped structures 1040 may be aligned with the respective LED 110. In some embodiments, for at least one LED 110, the dome-shaped structure 1040 may have a substantially convex shape with a base 1042 of the dome-shaped structure 1042 being parallel to the wavelength-converter structure 214 and at a distance from the wavelength-converter structure 214, and with a tip 1044 of the dome-shaped structure extending towards the wavelength-converter structure 214. This geometry is shown in the example of FIG. 10 for all of the LEDs 110. In some embodiments, an optically transparent material 1022 may be provided between the dome-shaped structures 1040 and the wavelength-converter structures 214, so that the tip 1044 is at a certain distance from the corresponding wavelength-converter structure 214, as shown in FIG. 10. In other embodiments, the dome-shaped structures 1040 may be implemented simply as the inverted version of the dome-shaped structures 940 shown in FIG. 9 in that the tip 1044 may be in contact with the corresponding wavelength-converter structure 214 (such an arrangement not specifically shown in the present drawings). The dome-shaped structures 1040 may be configured to diffuse light emerging from the wavelength-converter structure 214 of the respective LEDs 110 by virtue of being formed from the diffuser material 1020. The LEDs 110 shown in FIG. 10 (only one of which is labeled in order to not clutter the drawing) may be the LEDs of any of the LED arrays described with reference to FIGS. 1, 2A, and 2B. Together, the plurality of the LEDs 110, the dome-shaped structures 1040 of the diffuser material 1020, and, optionally, the optically transparent material 1022 provide one example of the diffusing segmented LED arrangement 350 described with reference to FIG. 3A and FIG. 3B, where the dome-shaped structures 1040 of the diffuser material 1020 are examples of diffusing elements of the layer 320. The diffuser material 1020 may be any of the materials listed for the diffuser material 420. The optically transparent material 1022 may be any of the materials listed for the optically transparent material 522. In some examples, a thickness of the diffuser material 1020 at the center of the dome-shaped structures 1040 may be about the same as that of the diffuser material 420.

FIG. 11 illustrates a cross-sectional side view of an example LED array 1100 with respective dome-shaped structures 1140 of a diffuser material 1120 with a rough or structured surface 1124 over each of the plurality of LEDs 110, according to some embodiments of the present disclosure. As shown in FIG. 11, in some embodiments, each of the dome-shaped structures 1140 may be aligned with the respective LED 110. In some embodiments, for at least one LED 110, the dome-shaped structure 1140 may have a substantially convex shape with a base 1142 of the dome-shaped structure 1142 aligned with the wavelength-converter structure, similar to the embodiment of FIG. 9. Different from FIG. 9 is that the surface 1124 of the dome-shaped structures 1140 may be rough or structured, e.g., similar to the surface 624 or the surface 724 described with reference to FIGS. 6 and 7, respectively. In some embodiments, a surface roughness of a portion of the dome-shaped structure 1140 extending away from the wavelength-converter structure 214 (i.e., not the base 1142 of the structure 1140) may be between about 10 nanometers and 200 micrometers, including all values and ranges therein. Such embodiments of providing either rough surface or otherwise shaped surfaces (e.g., providing multiple domes or multiple cones above each LED 110) may allow for deviation of the dome shape, e.g., when the luminance distribution of the LED 110 may not have a continuous decrease center to edges but might also have a more complex luminance over position dependence, e.g., due to thermal differences or current crowding.

In some embodiments, the base 1142 of the dome-shaped structures 1140 may be in contact with the corresponding wavelength-converter structures 214. The dome-shaped structures 1140 may be configured to diffuse light emerging from the wavelength-converter structure 214 of the respective LEDs 110 by virtue of being formed from the diffuser material 1120. In some embodiments, an optically transparent material 1122 may be provided over the dome-shaped structures 1140. The LEDs 110 shown in FIG. 11 (only one of which is labeled in order to not clutter the drawing) may be the LEDs of any of the LED arrays described with reference to FIGS. 1, 2A, and 2B. Together, the plurality of the LEDs 110, the dome-shaped structures 1140 of the diffuser material 1120, and, optionally, the optically transparent material 1122 provide one example of the diffusing segmented LED arrangement 350 described with reference to FIG. 3A and FIG. 3B, where the dome-shaped structures 1140 of the diffuser material 1120 are examples of diffusing elements of the layer 320. The diffuser material 1120 may be any of the materials listed for the diffuser material 420. The optically transparent material 1122 may be any of the materials listed for the optically transparent material 522. In some examples, an average thickness of the diffuser material 1120 at the center of the dome-shaped structures 1140 may be about the same as that of the diffuser material 420.

Although not specifically shown in the present drawings, in further embodiments, the diffusing element of the layer 320 may be realized by implementing the dome-shaped structures 1040 as described with reference to FIG. 10 except that at least some, or all of the dome-shaped structures 1040 may have a rough or structured surface as described with reference to the surface 1124 of the dome-shaped structures 1140 of FIG. 11. Furthermore, although also not specifically shown in the present drawings, in some embodiments, the dome-shaped structures as described herein may be implemented as cones or any other dome-like structures. Still further, although also not specifically shown in the present drawings, in some embodiments, the dome-shaped structures as described herein may extend over a plurality of LEDs 110 and/or over a plurality of LED segments 310.

Figure 12:
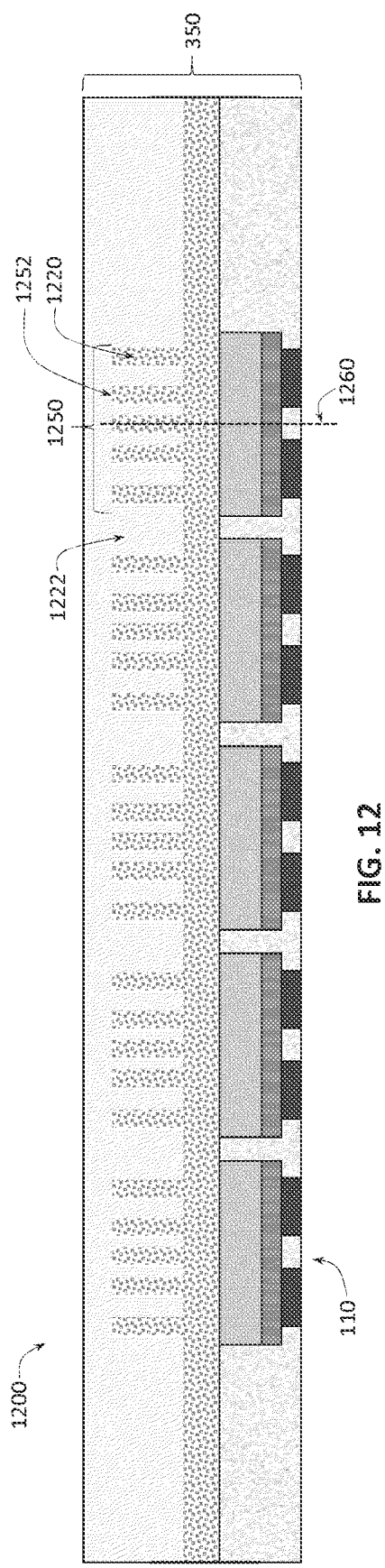
FIG. 12 illustrates a cross-sectional side view of an example LED array with respective sets of columns of a diffuser material over each of a plurality of LEDs, according to some embodiments of the present disclosure.

FIG. 12 illustrates a cross-sectional side view of an example LED array 1200 with respective sets 1250 of columns 1252 of a diffuser material 1220 over each of a plurality of the LEDs 110, according to some embodiments of the present disclosure. In some embodiments, optionally, a substantially optically transparent material 1222 may be provided between the columns 1252 and/or above the columns 1252. The LEDs 110 shown in FIG. 12 (only one of which is labeled in order to not clutter the drawing) may be the LEDs of any of the LED arrays described with reference to FIGS. 1, 2A, and 2B. Together, the plurality of the LEDs 110, the sets 1250 of the columns 1252, and, optionally, the optically transparent material 1222 provide one example of the diffusing segmented LED arrangement 350 described with reference to FIG. 3A and FIG. 3B, where the sets 1250 of the columns 1252 are examples of diffusing elements of the layer 320. The diffuser material 1220 may be any of the materials listed for the diffuser material 420. The optically transparent material 1222 may be any of the materials listed for the optically transparent material 522. As shown in FIG. 12, in some embodiments, each of the sets 1250 may be aligned with the respective LED 110. In some embodiments, for at least one LED 110, a density of the plurality of columns 1252 may be higher in a region centered around an optical axis of the LED 110 (the optical axis schematically illustrated in FIG. 12 with a dashed line 1260 for one of the LEDs 110) than in a region farther away from the optical axis 1260 of the LED 119. In other words, the density of the columns 1252 may be higher in the central region of the LED 110 compared to that at the periphery of the LED 110. In some embodiments, for at least one LED 110, a width of each of the columns 1252 (where, as used herein, the term "width" refers to a dimension measured in a direction in a plane parallel to the support structure over/in which the LEDs 110 are provided) may be between about 0.01% (e.g., so-called "meta-lens" type structures, e.g., photonic crystals) and 10%, e.g., between about 5% and 10% of a width of the LED 110, e.g., of the width of the wavelength-converter structure 214 of the LED 110. In some embodiments, for at least one LED 110, a height of each of the columns 1252 (where, as used herein, the term "height" refers to a dimension measured in a direction perpendicular to the support structure over/in which the LEDs 110 are provided) may be between about 0.1 micrometers (e.g., for the meta-lens type structures) and 500 micrometers, e.g., between about 10 and 500 micrometers, including all values and ranges therein, e.g., between about 50 and 100 micrometers. In some embodiments, for at least some, or all LEDs 119, there may be a layer of the diffuser material 1220 between the wavelength-converter structure(s) 214 and the set(s) 1250 of columns 1252, as shown in FIG. 12 for all of the LEDs 110. In such embodiments, the layer of the diffuser material 1220 may be in contact with the wavelength-converter structures 214 of the LEDs 110 and the plurality of columns 1252 of each of the sets 1250 may be in contact with the layer of the diffuser material 1220 underneath the columns.

Figure 13:
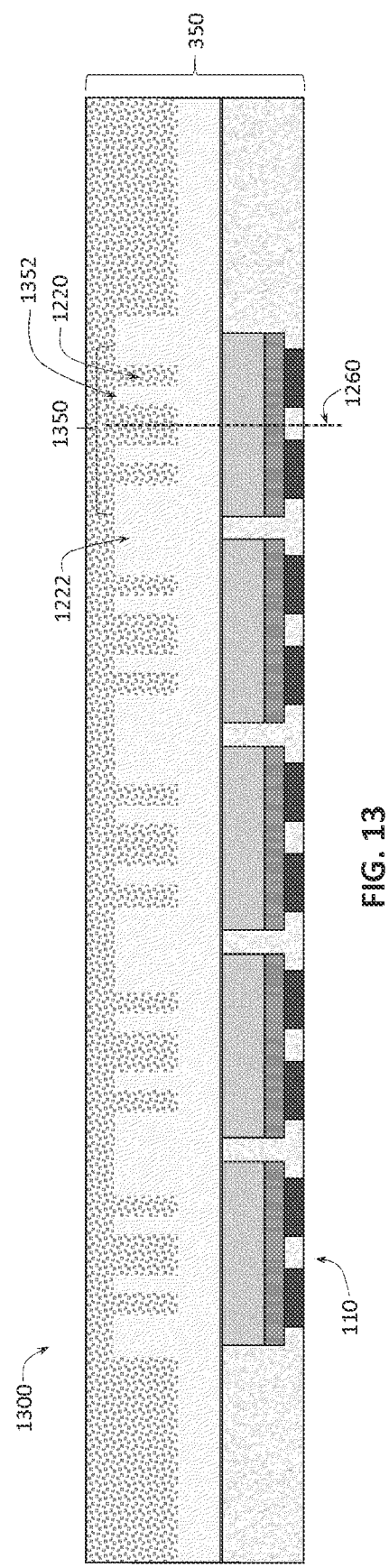
FIG. 13 illustrates a cross-sectional side view of an example LED array with respective sets of columns of a diffuser material over each of a plurality of LEDs, according to other embodiments of the present disclosure.

FIG. 13 illustrates a cross-sectional side view of an example LED array 1300 with respective sets 1350 of columns 1350 of the diffuser material 1220 over each of a plurality of LEDs 110, according to other embodiments of the present disclosure. FIG. 13 illustrates an embodiment as that shown in FIG. 12 except where the diffuser material 1220 and the optically transparent material 1222 are switched with one another. Except for this, other descriptions provided with respect to FIG. 12 are applicable to FIG. 13 and, in the interests of brevity, are not repeated.

Although not specifically shown in the present drawings, in further embodiments, the columns 1252 or 1352 may have other shapes, e.g., may be rounded, dome-shaped or cone-shaped. Furthermore, although also not specifically shown in the present drawings, in some embodiments, the sets 1250/1350 of columns 1252/1352 as described herein may extend over a plurality of LEDs 110 and/or over a plurality of LED segments 310.

Various designs of diffusing elements illustrated in FIGS. 4-13 and described above provide some examples of diffusing elements that may be provided in the light path between the wavelength-converter structures 214 and the optical elements 330. Some combinations of the various embodiments of FIGS. 4-13 have been described above. However, in further embodiments, further combinations of the various embodiments of FIGS. 4-13 may be possible and are within the scope of the present disclosure. For example, in some further embodiments, the columns 1252/1352 as described with reference to FIGS. 12 and 13 may have rough or structured surfaces as described with reference to FIGS. 6 and 7. In another example, in some further embodiments, partial segmentation implemented with the walls 830 as described with reference to FIG. 8 may be included in any other embodiments described with reference to FIGS. 5-7 and 9-13. In yet one more example, in some further embodiments, the walls 230 as described with reference to FIG. 2B may be included in any of the embodiments described with reference to FIGS. 4-13. Furthermore, all of the designs of diffusing elements illustrated in FIGS. 4-13 and described above, including all variations described herein, are equally applicable to embodiments there the wavelength-converter structures 214 are not used in some or all of the LEDs 110, in which case the diffusing elements are provided in the light path between the light emitter arrangement 212 and the optical elements 330.

FIGS. 2A-2B and FIGS. 4-13 are intended to show relative arrangements of the elements therein, and the device assemblies of these figures may include other elements that are not specifically illustrated (e.g., various interfacial layers). Similarly, although particular arrangements of materials are discussed with reference to FIGS. 2A-2B and FIGS. 4-13, intermediate materials may be included in the integrated circuit (IC) devices and assemblies of these figures. Still further, although some elements of the various cross-sectional views are illustrated in FIGS. 2A-2B and FIGS. 4-13 as being planar rectangles or formed of rectangular solids, this is simply for ease of illustration, and embodiments of these assemblies may be curved, rounded, or otherwise irregularly shaped as dictated by, and sometimes inevitable due to, the manufacturing processes used to fabricate such device assemblies.

Example System with a Segmented LED Array with One or More Diffusing Elements

Figure 14:
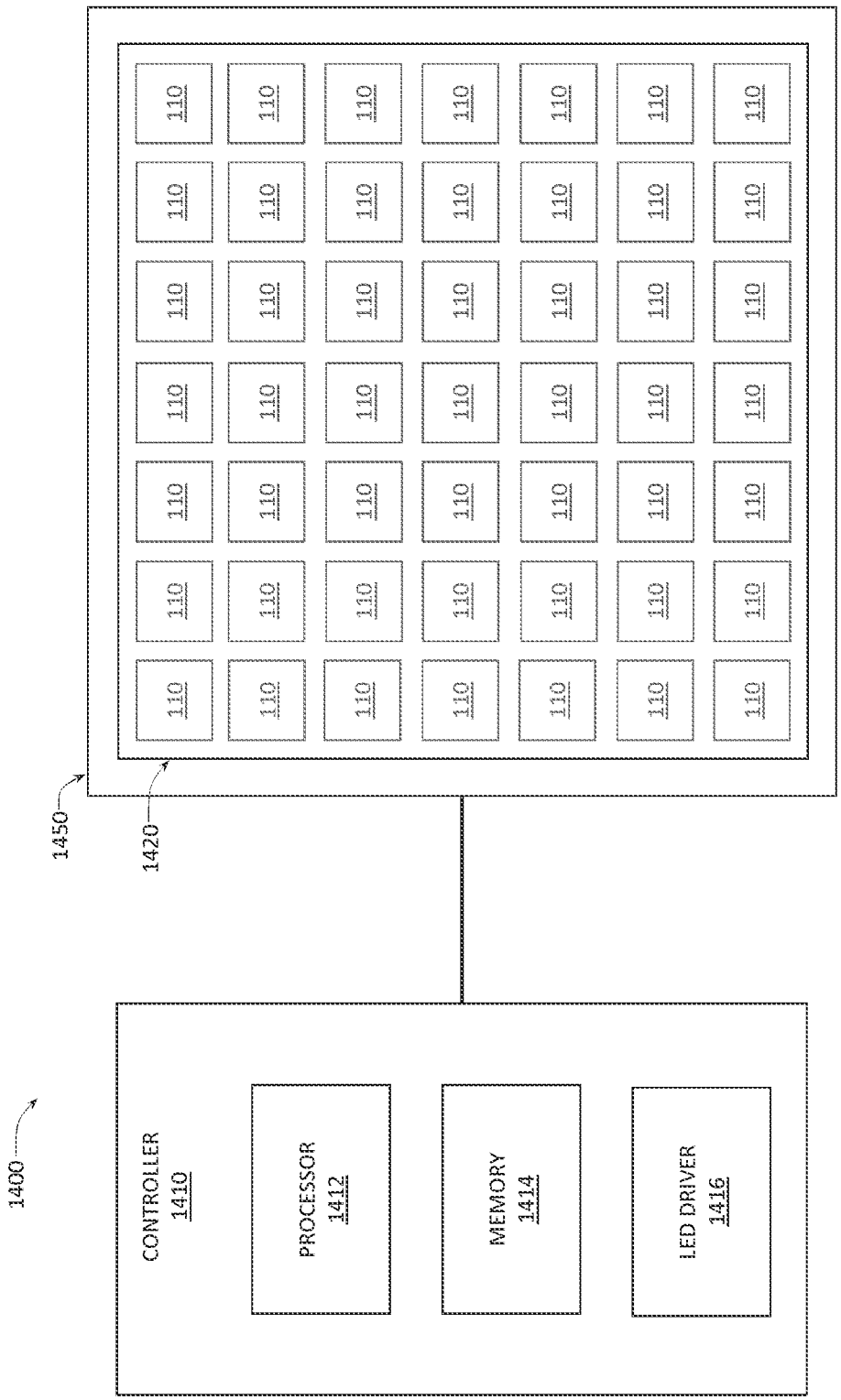
FIG. 14 provides a block diagram illustrating an example system with a light emitter and a controller, according to some embodiments of the present disclosure.

Light emitters with one or more segmented LED arrays with one or more diffusing elements provided in the light path between the light emitter arrangement 212 or the wavelength-converter material and further optics, as described herein, may be included in any suitable system, e.g., in an adaptive lighting system. FIG. 14 provides a block diagram illustrating an example system 1400 with a light emitter 1450 and a controller 1410, according to some embodiments of the present disclosure.

The light emitter 1450 may include an LED array of a plurality of the LEDs 110 as described with reference to FIG. 1, further including a layer 1420 of one or more diffusing elements provided in the light path between the light emitter arrangement 212 or the wavelength-converter material of the LEDs 110 and further optics. For example, the plurality of the LEDs 110 of the light emitter 1450 could be arranged as described with reference to FIG. 3A and FIG. 3B, and the layer 1420 could be implemented as the diffusing segmented LED arrangement 350 described with reference to FIG. 3A and FIG. 3B, some examples of which have been described with reference to FIGS. 4-13.

As shown in FIG. 14, the controller 1410 may include a processor 1412, a memory 1414, and an LED driver 1416.

The processor 1412, e.g. a hardware processor 1412, can execute software or an algorithm to perform the activities as discussed in this specification, in particular activities related to controlling the LEDs 110 of the light emitter 1450. To that end, the processor 1412 may include any combination of hardware, software, or firmware providing programmable logic, including by way of non-limiting example a microprocessor, a digital signal processor (DSP), an application-specific integrated circuit (ASIC) processor, a field-programmable gate array (FPGA), a general-purpose processor (e.g., an ARM-based processor, an x86-based processor, a MIPS processor, etc.), or a virtual machine processor. In some embodiments, the processor 1412 may be communicatively coupled to the memory 1414, for example in a direct-memory access (DMA) configuration, so that the processor 1412 may read from or write to the memory 1414. In some embodiments, the processor 1412 may be coupled to the memory 1414 through a system bus (not shown in FIG. 14). The processor 1412 may be configured to execute program code stored in the memory 1414, e.g., by accessing the program code from the memory 1414 via a system bus.

The memory 1414 may include any suitable type of volatile and non-volatile memory technology, including double data rate (DDR) random access memory (RAM), synchronous RAM (SRAM), dynamic RAM (DRAM), flash, read-only memory (ROM), optical media, virtual memory regions, magnetic or tape memory, or any other suitable technology. The information being measured, processed, tracked or sent to or from any of the components of the system 1400 could be provided in any database, register, control list, cache, or storage structure, all of which can be referenced at any suitable timeframe. Any such storage options may be included within the broad term "memory" as used herein The driver 1416 may include any suitable type of electronic circuit configured to bias and/or supply current to any of the LEDs in the light emitter 1450.

In some implementations, the controller 1410 may configure some of the LEDs in the light emitter 1450 to operate as emitters by applying a forward bias to those LEDs. In some implementations, the controller 1410 may be configured to address each of the LEDs in the light emitter 1450 individually. For example, the controller 1410 may be configured to change the magnitude of the bias of any LED in the light emitter 1450 independently from the rest. As another example, the controller 1410 may be configured to increase or decrease the current supplied to any LED in the light emitter 1450 without changing the supply of current to any of the other LEDs in the light emitter 1450. Although in the present example the controller 1410 is used to control an LED matrix shown to have a single segmented LED chip, alternative implementations are possible in which the controller 1410 is configured to control any suitable type of LED matrix, such as a matrix including multiple segmented LED chips, and/or a matrix including one or more non-segmented LED chips.

Although not specifically shown in FIG. 14, in some embodiments, input/output (I/O) devices can, optionally, be coupled to the controller 1410. Examples of input devices may include, but are not limited to, a keyboard, a pointing device such as a mouse, or the like. Examples of output devices may include, but are not limited to, a monitor or a display, speakers, or the like. In some embodiments, an output device coupled to the controller 1410 may be any type of screen display, such as plasma display, liquid crystal display (LCD), organic light emitting diode (OLED) display, electroluminescent (EL) display, or any other indicator, such as a dial, barometer, or LED. In some implementations, the system 1400 may include a driver (not shown) for the output device. Input and/or output devices may be coupled to the controller 1410 either directly or through intervening I/O controllers. In an embodiment, the input and the output devices may be implemented as a combined input/output device, such as a touch sensitive display, also sometimes referred to as a "touch screen display" or simply "touch screen". In such an embodiment, input to the device may be provided by a movement of a physical object, such as e.g. a stylus or a finger of a user, on or near the touch screen display.

Although also not specifically shown in FIG. 14, in some embodiments, a camera and, optionally, an image processing device, could be coupled to the controller 1410, configured to provide input to the controller 1410. For example, the light emitter 1450 may act as a camera flash while the camera is acquiring an image (which could be one of the frames of a video that the camera is acquiring), then the controller 1410 may analyze the acquired image and adjust the illumination to the scene by adjusting the drive signals provided to the individual LEDS of the light emitter 1450.

Although also not shown in FIG. 14, in some embodiments, a network adapter may also, optionally, be coupled to the controller 1410 to enable it to become coupled to other systems, computer systems, remote network devices, and/or remote storage devices through intervening private or public networks. The network adapter may comprise a data receiver for receiving data that is transmitted by said systems, devices and/or networks to the controller 1410, and a data transmitter for transmitting data from the controller 1410 to said systems, devices and/or networks. Modems, cable modems, and Ethernet cards are examples of different types of network adapter that may be used with the system 1400.

An array of independently operable LEDs may be used in combination with a lens, lens system, or other optical system (e.g., as described above) to provide illumination that is adaptable for a particular purpose. For example, in operation such an adaptive lighting system may provide illumination that varies by color and/or intensity across an illuminated scene or object and/or is aimed in a desired direction. A controller can be configured to receive data indicating locations and color characteristics of objects or persons in a scene and based on that information control LEDs in an LED array to provide illumination adapted to the scene. Such data can be provided for example by an image sensor, or optical (e.g. laser scanning) or non-optical (e.g. millimeter radar) sensors. Such adaptive illumination is increasingly important for automotive, mobile device camera, VR, and AR applications. Adaptive lighting systems employed for such applications may comprise diffusing elements as described herein.

Figure 15:
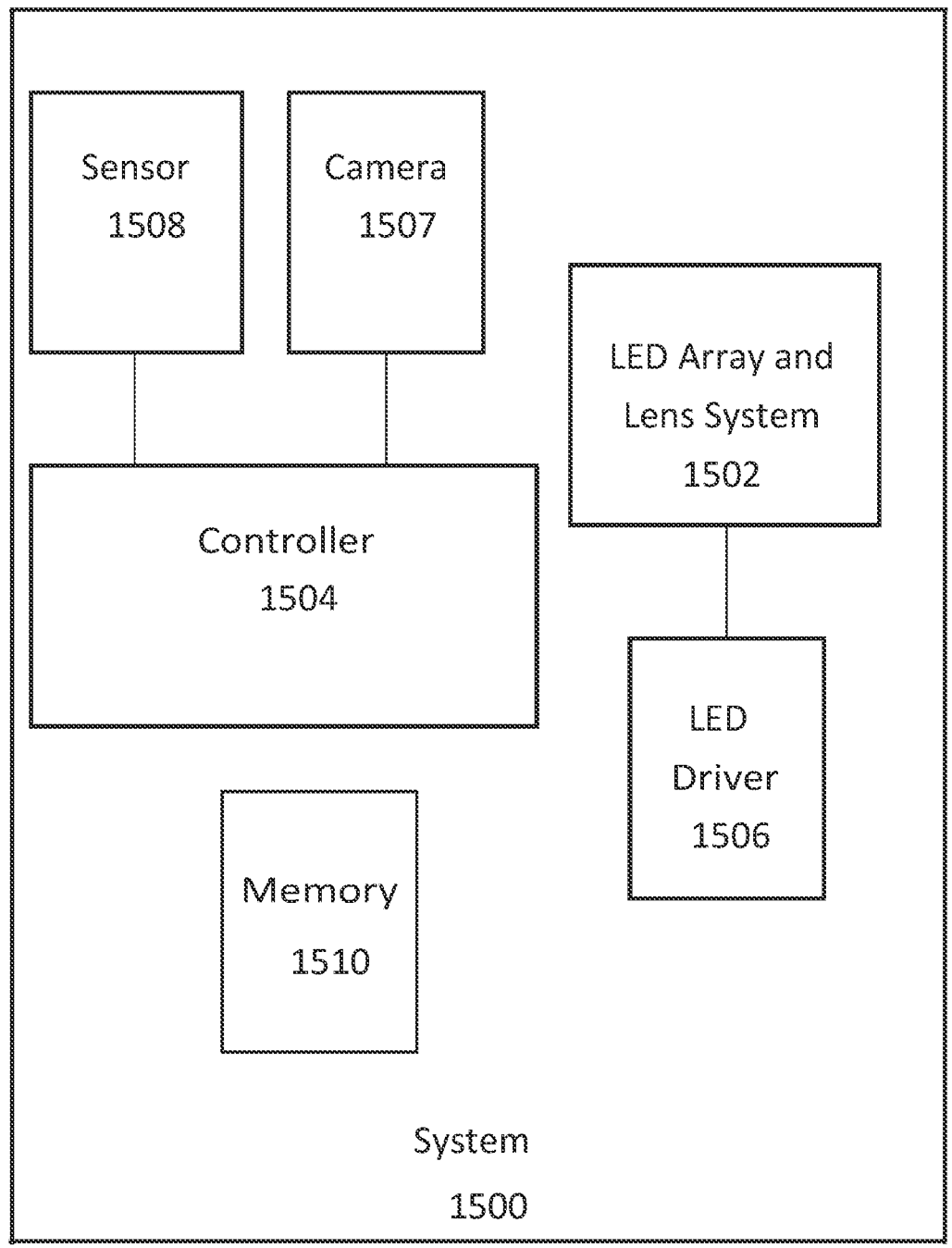
FIG. 15 provides a block diagram schematically illustrating an example camera flash system comprising an adaptive illumination system.

FIG. 15 schematically illustrates an example camera flash system 1500 comprising an LED array and lens system 1502, which may be similar or identical to the systems described above. Flash system 1500 also comprises an LED driver 1506 that is controlled by a controller 1504, such as a microprocessor. Controller 1504 may also be coupled to a camera 1507 and to sensors 1508, and operate in accordance with instructions and profiles stored in memory 1510. Camera 1507 and adaptive illumination system 1502 may be controlled by controller 1504 to match their fields of view.

Sensors 1508 may include, for example, positional sensors (e.g., a gyroscope and/or accelerometer) and/or other sensors that may be used to determine the position, speed, and orientation of system 1500. The signals from the sensors 1508 may be supplied to the controller 1504 to be used to determine the appropriate course of action of the controller 1504 (e.g., which LEDs are currently illuminating a target and which LEDs will be illuminating the target a predetermined amount of time later).

In operation, illumination from some or all of the pixels of the LED array in 1502 may be adjusted—deactivated, operated at full intensity, or operated at an intermediate intensity. As noted above, beam focus or steering of light emitted by the LED array in 1502 can be performed electronically by activating one or more subsets of the pixels, to permit dynamic adjustment of the beam shape without moving optics or changing the focus of the lens in the lighting apparatus.

Figure 16:
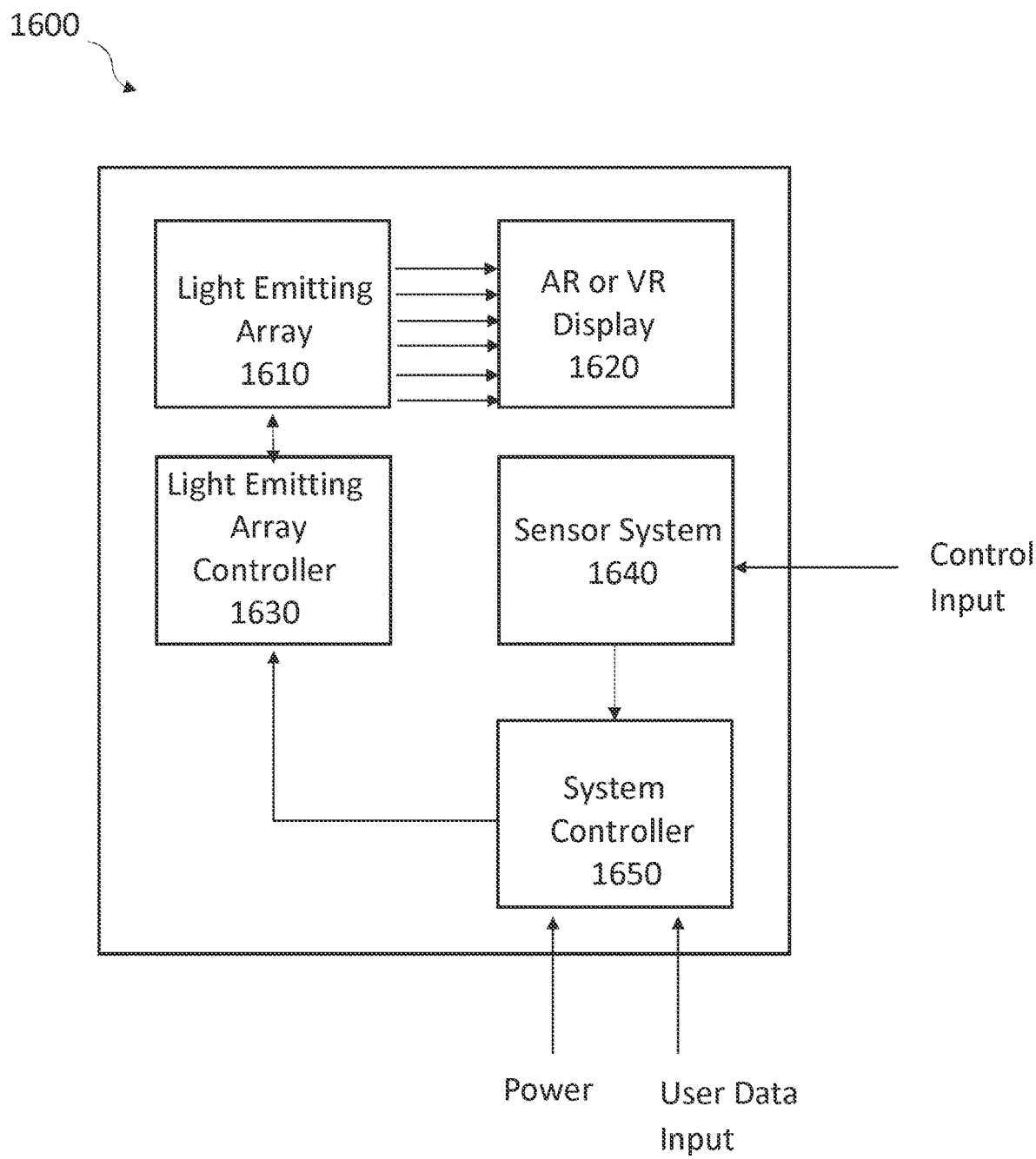
FIG. 16 provides a block diagram schematically illustrating an example AR/VR system that includes an adaptive illumination system.

FIG. 16 schematically illustrates an example AR/VR system 1600 that includes an adaptive light emitting array 1610, AR or VR display 1620, a light emitting array controller 1630, sensor system 1640, and system controller 1650. Control input is provided to the sensor system 1640, while power and user data input is provided to the system controller 1650. In some embodiments modules included in the AR/VR system 1600 can be compactly arranged in a single structure, or one or more elements can be separately mounted and connected via wireless or wired communication. For example, the light emitting array 1610, AR or VR display 1620, and sensor system 1640 can be mounted on a headset or glasses, with the light emitting controller and/or system controller 1650 separately mounted.

The light emitting array 1610 may include one or more adaptive light emitting arrays, as described above, for example, that can be used to project light in graphical or object patterns that can support AR/VR systems. In some embodiments, arrays of microLEDs can be used.

The AR/VR system 1600 can incorporate a wide range of optics in adaptive light emitting array 1610 and/or AR/VR display 1620, for example to couple light emitted by adaptive light emitting array 1610 into AR/VR display 1620.

Sensor system 1640 can include, for example, external sensors such as cameras, depth sensors, or audio sensors that monitor the environment, and internal sensors such as accelerometers or two or three axis gyroscopes that monitor AR/VR headset position. Other sensors can include but are not limited to air pressure, stress sensors, temperature sensors, or any other suitable sensors needed for local or remote environmental monitoring. In some embodiments, control input can include detected touch or taps, gestural input, or control based on headset or display position.

In response to data from sensor system 1640, system controller 1650 can send images or instructions to the light emitting array controller 1630. Changes or modification to the images or instructions can also be made by user data input, or automated data input as needed. User data input can include but is not limited to that provided by audio instructions, haptic feedback, eye or pupil positioning, or connected keyboard, mouse, or game controller.

SELECT EXAMPLES

Example 1 provides a light emitter that includes a support structure (e.g., a substrate, a chip, or a die); and a segmented LED array (also referred to as "matrix") including a plurality of LEDs provided over the support structure and, optionally, optically and electrically separated from one another by walls, where the plurality of LEDs are arranged in a plurality of sections (where a given section may include one or more LEDs), each section being aligned with a different respective optical element of a plurality of optical elements. Each LED of the plurality of LEDs includes a light emitter arrangement (and, optionally, a wavelength-converter structure provided over the light emitter arrangement), and a plurality of columns of a diffuser material provided over the light emitter arrangement or the wavelength-converter structure and configured to diffuse light emerging from the light emitter arrangement or the wavelength-converter structure, where the plurality of columns is in a light path between the wavelength-converter structure and at least one of the plurality of optical elements.

Example 2 provides the light emitter according to example 1, where, for at least one LED of the plurality of LEDs, a density of the plurality of columns is higher in a region centered on an optical axis of the LED than in a region farther away from the optical axis of the LED. In other words, the density of columns is higher in the central region of the LED compared to that at the periphery of the LED Example 3 provides the light emitter according to examples 1 or 2, where, for at least one LED of the plurality of LEDs, a width of each of the columns (where, as used herein, the term "width" refers to a dimension measured in a direction in a plane parallel to the support structure) is between about 0.01% and 10% of a width of the LED, e.g. of the width of the light emitter arrangement or the wavelength-converter structure of the LED.

Example 4 provides the light emitter according to any one of the preceding examples, where, for at least one LED of the plurality of LEDs, a height of each of the columns (where, as used herein, the term "height" refers to a dimension measured in a direction perpendicular to the support structure) is between about 0.1 and 500 micrometers, including all values and ranges therein, e.g., between about 50 and 100 micrometers.

Example 5 provides the light emitter according to any one of examples 1-4, where the each LED further includes a layer of the diffuser material between the light emitter arrangement or the wavelength-converter structure and the plurality of columns, the layer of the diffuser material is in contact with the light emitter arrangement or, if used, the wavelength-converter structure, and the plurality of columns is in contact with the layer of the diffuser material.

Example 6 provides the light emitter according to example 5, further including a substantially optically transparent material between the columns, e.g., a material that is at least about 90% transparent to the light emitted from the light emitter arrangement or, if used, the wavelength-converter structure, e.g., silicone.

Example 7 provides the light emitter according to any one of examples 1-4, where the each LED further includes a layer of a substantially optically transparent material between the light emitter arrangement or the wavelength-converter structure and the plurality of columns, e.g., a material that is at least 90% transparent to the light emitted from the light emitter arrangement or the wavelength-converter structure (e.g., silicone), the layer of the substantially optically transparent material is in contact with the light emitter arrangement or the wavelength-converter structure, and the plurality of columns is in contact with the layer of the substantially optically transparent material.

Example 8 provides the light emitter according to example 7, further including the substantially optically transparent material between the columns.

Example 9 provides a light emitter that includes a support structure; and a segmented LED array including a plurality of LEDs provided over the support structure and, optionally, optically and electrically separated from one another by walls, where the plurality of LEDs are arranged in a plurality of sections (where a given section may include one or more LEDs), each section being aligned with a different respective optical element of a plurality of optical elements, and where each LED of the plurality of LEDs includes a light emitter arrangement (and, optionally, a wavelength-converter structure provided over the light emitter arrangement) and a dome-shaped structure of a diffuser material provided over the light emitter arrangement or the wavelength-converter structure, aligned with the LED, and configured to diffuse light emerging from the light emitter arrangement or the wavelength-converter structure, where the dome-shaped structure is in a light path between the light emitter arrangement or the wavelength-converter structure and at least one of the plurality of optical elements.

Example 10 provides the light emitter according to example 9, where, for at least one LED of the plurality of LEDs, the dome-shaped structure has a substantially convex shape with a base of the dome-shaped structure aligned with the light emitter arrangement or the wavelength-converter structure and with a tip of the dome-shaped structure extending away from the light emitter arrangement or the wavelength-converter structure.

Example 11 provides the light emitter according to example 10, where the base of the dome-shaped structure is in contact with the light emitter arrangement or the wavelength-converter structure.

Example 12 provides the light emitter according to examples 10 or 11, where a surface roughness of a portion of the dome-shaped structure extending away from the light emitter arrangement or the wavelength-converter structure (i.e., not the base of the structure) is between about 10 nanometers and 200 micrometers, including all values and ranges therein.

Example 13 provides the light emitter according to example 9, where, for at least one LED of the plurality of LEDs, the dome-shaped structure has a substantially convex shape with a base of the dome-shaped structure being parallel to the light emitter arrangement or the wavelength-converter structure and at a distance from the light emitter arrangement or the wavelength-converter structure, and with a tip of the dome-shaped structure extending away from the base, towards the light emitter arrangement or the wavelength-converter structure.

Example 14 provides the light emitter according to example 13, where a surface roughness of a portion of the dome-shaped structure extending away from the base and towards the light emitter arrangement or the wavelength-converter structure is between about 10 nanometers and 200 micrometers, including all values and ranges therein. In some embodiments, a layer of a substantially optically transparent material may be included between the light emitter arrangement or the wavelength-converter structure and the dome-shaped structures, e.g., a material that is at least about 90% transparent to the light emitted from the light emitter arrangement or the wavelength-converter structure (e.g., silicone).

Example 15 provides a light emitter that includes a support structure and a segmented LED array including a plurality of LEDs provided over the support structure and, optionally, optically and electrically separated from one another by walls, where the plurality of LEDs are arranged in a plurality of sections (where a given section may include one or more LEDs), each section being aligned with a different respective optical element of a plurality of optical elements, and where each LED of the plurality of LEDs includes a light emitter arrangement, and, optionally, a wavelength-converter structure provided over the light emitter arrangement, and where the light emitter further includes a continuous layer of a diffuser material provided over the light emitter arrangement or the wavelength-converter structure of at least two or more LEDs and configured to diffuse light emerging from the light emitter arrangement or the wavelength-converter structure of the at least two or more LEDs, the diffuser material being in a light path between the light emitter arrangement or the wavelength-converter structure of the at least two or more LEDs and at least one of the plurality of optical elements.

Example 16 provides the light emitter according to example 15, where a surface roughness of the diffuser material is between about 10 nanometers and 200 micrometers, including all values and ranges therein.

Example 17 provides the light emitter according to any one of the preceding examples, further including walls of an optically non-transparent material between each pair of adjacent LEDs.

Example 18 provides the light emitter according to any one of the preceding examples, where the light emitter arrangement includes a first semiconductor layer doped with dopants of a first type, provided over the support structure, an active layer provided over the first semiconductor layer, and a second semiconductor layer doped with dopant of a second type, the second semiconductor layer provided over the active layer.

Example 19 provides the light emitter according to any one of examples 1-18, where at least one of the plurality of optical elements includes an aperture configured to guide light that is incident on the optical element from the optical element's central direction while absorbing light that is incident on the optical element from another direction.

Example 20 provides the light emitter according to any one of examples 1-18, where at least one of the plurality of optical elements includes a lens.

Example 21 provides an electronic device that includes a controller that includes an LED driver and a light emitter that includes a plurality of LEDs, where the LED driver is configured to drive the plurality of LEDs, and where the light emitter is a light emitter according to any one of the preceding examples.

Example 22 provides the electronic device according to example 21, where the controller further includes a processor and a memory.

Example 23 provides the electronic device according to examples 21 or 22, where the electronic device is a camera device that includes a camera, and where the light emitter is a flash for the camera.

Example 24 provides the electronic device according to any one of examples 21-23, where the electronic device is a wearable electronic device (e.g., a smart watch) or a hand-held electronic device (e.g., a mobile phone).

Example 25 provides a light emitting device comprising an LED array including two or more LEDs arranged with adjacent LEDs spaced apart from each other, an optical element arranged to collect light from the LEDs to form an optical output from the light emitting device, and a continuous layer of light diffusing material disposed over a plurality of the LEDs between the LEDs and the optical element. The light diffusing material may be or comprise wavelength converting material. Alternatively, the light diffusing material may be or comprise a material that diffuses but does not absorb light emitted by the LEDs. Adjacent LEDs in the array are separated by walls comprising wavelength converting material such as phosphor particles, for example. The walls may in addition comprise light scattering particles that do not absorb light emitted by the LED. If the continuous layer of diffusing material comprises wavelength converting material, it may be the same as or different from the wavelength converting material in the walls and may be present in the same concentration or a different concentration compared to that in the walls.

This disclosure is illustrative and not limiting. Further modifications will be apparent to one skilled in the art in light of this disclosure and are intended to fall within the scope of the appended claims.

The invention claimed is:

1. A light emitting device comprising:
an array of multiple LEDs arranged so as to emit array output light, the LEDs of the array being separated from one another by trenches filled with non-transparent material or by non-transparent walls;
one or more optical elements arranged so as to direct at least a portion of the array output light to form an image of the array; and
one or more light diffusing structures positioned in a light path between two or more light emitting elements of the array and one or more of the optical elements, the one or more light diffusing structures being arranged so as to reduce or eliminate, in the image of the array, appearance of the trenches or walls.

2. The light emitting device of claim 1, wherein the light diffusing structures are configured to diffuse but not absorb light emitted by the LEDs.

3. The light emitting device of claim 1, wherein each LED is operable independently of at least one other LED.

4. The light emitting device of claim 1, wherein each LED of the array is a segment of a monolithic structure.

5. The light emitting device of claim 4, wherein each LED has nonzero dimensions in a plane of the array of less than or equal to 500 microns.

6. The light emitting device of claim 1, wherein the trenches or walls separating adjacent LEDs have nonzero widths less than or equal to 200 microns.

7. The light emitting device of claim 1, wherein the one or more light diffusing structures comprise a continuous layer of light diffusing material disposed over a plurality of the LEDs.

8. The light emitting device of claim 7, wherein the continuous layer of light diffusing material is disposed on the LEDs.

9. The light emitting device of claim 7 comprising a layer of transparent material disposed on the LEDs, wherein the continuous layer of light diffusing material is disposed on the layer of transparent material opposite from the LEDs.

10. The light emitting device of claim 7, wherein the continuous layer of light diffusing material is partially segmented at locations between adjacent ones of the LEDs.

11. The light emitting device of claim 1, wherein the one or more light diffusing structures comprise a continuous layer of transparent material disposed over a plurality of the LEDs, the layer of transparent material comprising an irregularly rough light scattering surface opposite from the LEDs.

12. The light emitting device of claim 1, wherein the one or more light diffusing structures comprise a continuous layer of transparent material disposed over a plurality of the LEDs, the layer of transparent material comprising a periodic textured light scattering surface opposite from the LEDs.

13. The light emitting device of claim 1, wherein the one or more light diffusing structures comprise a plurality of discrete light diffusing structures each aligned with a corresponding one of the LEDs.

14. The light emitting device of claim 13, wherein each discreet light diffusing structure is dome shaped.

15. The light emitting device of claim 14, wherein each dome comprises a flat surface and an oppositely positioned convexly shaped surface, and the flat surface faces the LED.

16. The light emitting device of claim 14, wherein each dome comprises a flat surface and a convexly shaped surface, and the flat surface faces the optical element.

17. The light emitting device of claim 1, wherein the one or more light diffusing structures comprise columns of light diffusing material oriented with their columnar axes extending away from the LEDs.

18. The light emitting device of claim 17, wherein the columns of light diffusing material are embedded in a layer of transparent material.

19. A mobile device comprising:
a camera; and
the light emitting device of claim 1, the one or more optical elements of which are arranged to direct light from the array of LEDs into a field of view of the camera.

20. A display system comprising:
a display; and
the light emitting device of claim 1, the one or more optical elements of which are arranged to couple light from the array of LEDs into the display.

* * * * *